US012677522B2

(12) United States Patent
Bailie et al.

(10) Patent No.: US 12,677,522 B2
(45) Date of Patent: Jul. 7, 2026

(54) THIN FILM PHOTOVOLTAIC MODULES WITH PERIMETER BYPASS DIODES

(71) Applicant: Tandem PV, San Jose, CA (US)

(72) Inventors: Colin David Bailie, Morgan Hill, CA (US); Chris Eberspacher, Palo Alto, CA (US)

(73) Assignee: TANDEM PV, San Jose, CA (US)

( * ) Notice: Subject to any disclaimer, the term of this patent is extended or adjusted under 35 U.S.C. 154(b) by 0 days.

(21) Appl. No.: 18/919,135

(22) Filed: Oct. 17, 2024

(65) Prior Publication Data

US 2025/0126958 A1 Apr. 17, 2025

Related U.S. Application Data

(60) Provisional application No. 63/544,583, filed on Oct. 17, 2023.

(51) Int. Cl.
*H10K 39/18* (2026.01)
*H10K 30/40* (2023.01)
*H10K 39/12* (2026.01)

(52) U.S. Cl.
CPC ............. *H10K 39/18* (2023.02); *H10K 39/12* (2023.02); *H10K 30/40* (2023.02)

(58) Field of Classification Search
CPC ......... H10K 39/18; H10K 39/12; H10K 30/40
See application file for complete search history.

(56) References Cited

U.S. PATENT DOCUMENTS

2020/0295209 A1* 9/2020 Bush ...................... H10F 19/35

* cited by examiner

*Primary Examiner* — Angelo Trivisonno
(74) *Attorney, Agent, or Firm* — Patterson + Sheridan, LLP

(57) ABSTRACT

Embodiments of the disclosure include a photovoltaic device including a plurality of photovoltaic cells coupled in series. The photovoltaic cells include a first contact layer, a first charge transport layer (CTL) disposed over the first contact layer, an absorber layer disposed over the first CTL, a second CTL disposed over the absorber layer; and a second contact layer disposed over the second CTL. A plurality of diodes are positioned in diode regions that are located on opposite edges of the plurality of PV cells. The plurality of diodes are coupled in series and are configured to form a diode between adjacent PV cells of the plurality PV cells.

20 Claims, 14 Drawing Sheets

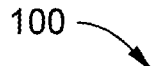
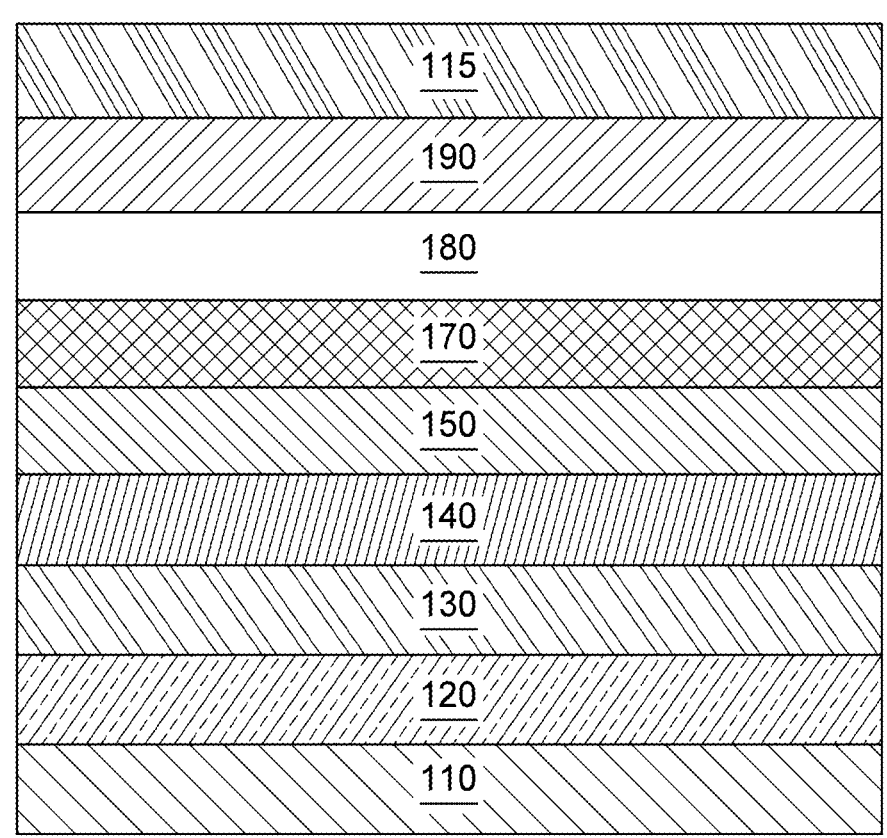
FIG. 1
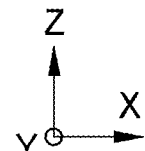

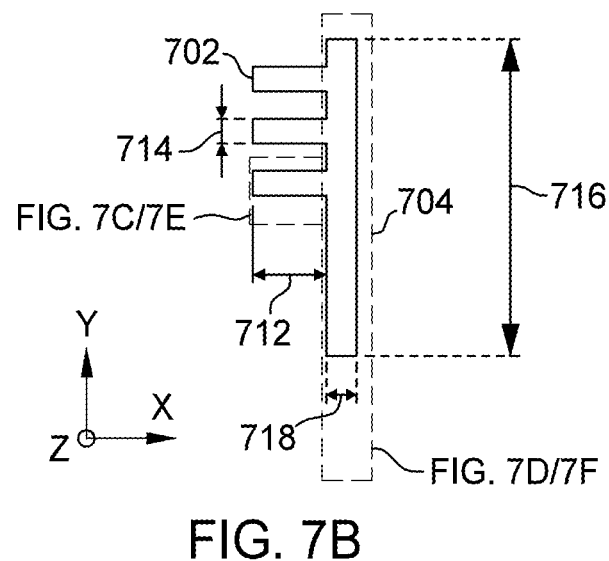
FIG. 7B
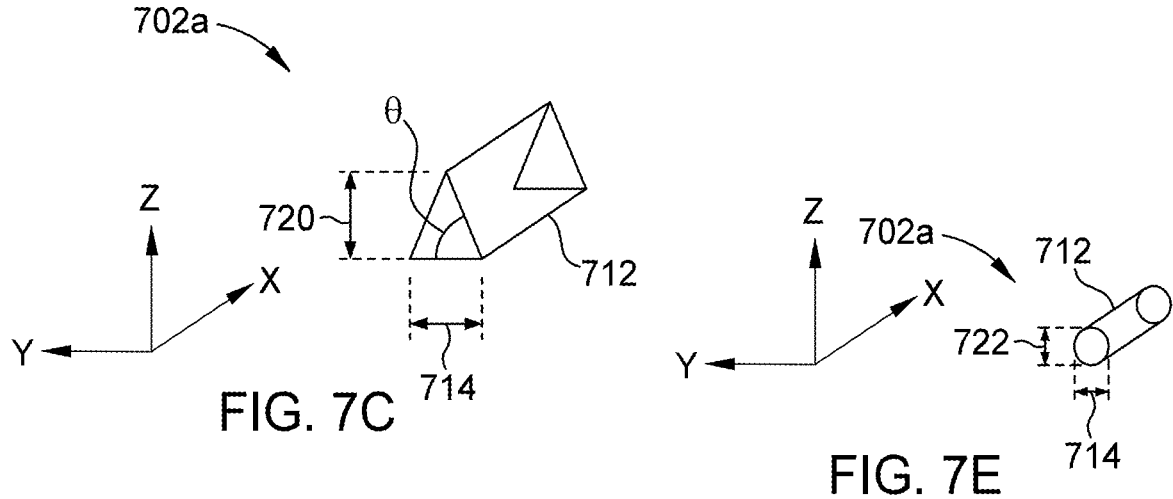
FIG. 7C
FIG. 7E
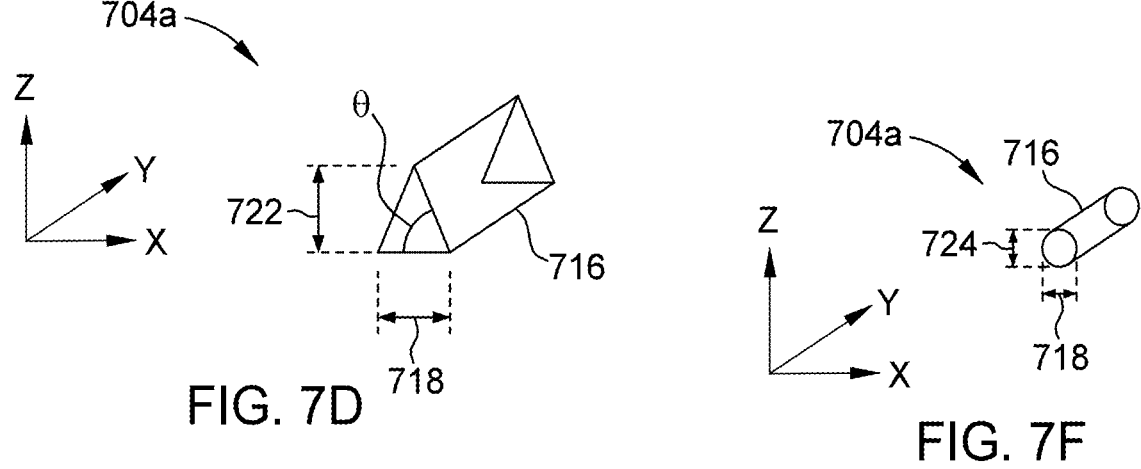
FIG. 7D
FIG. 7F

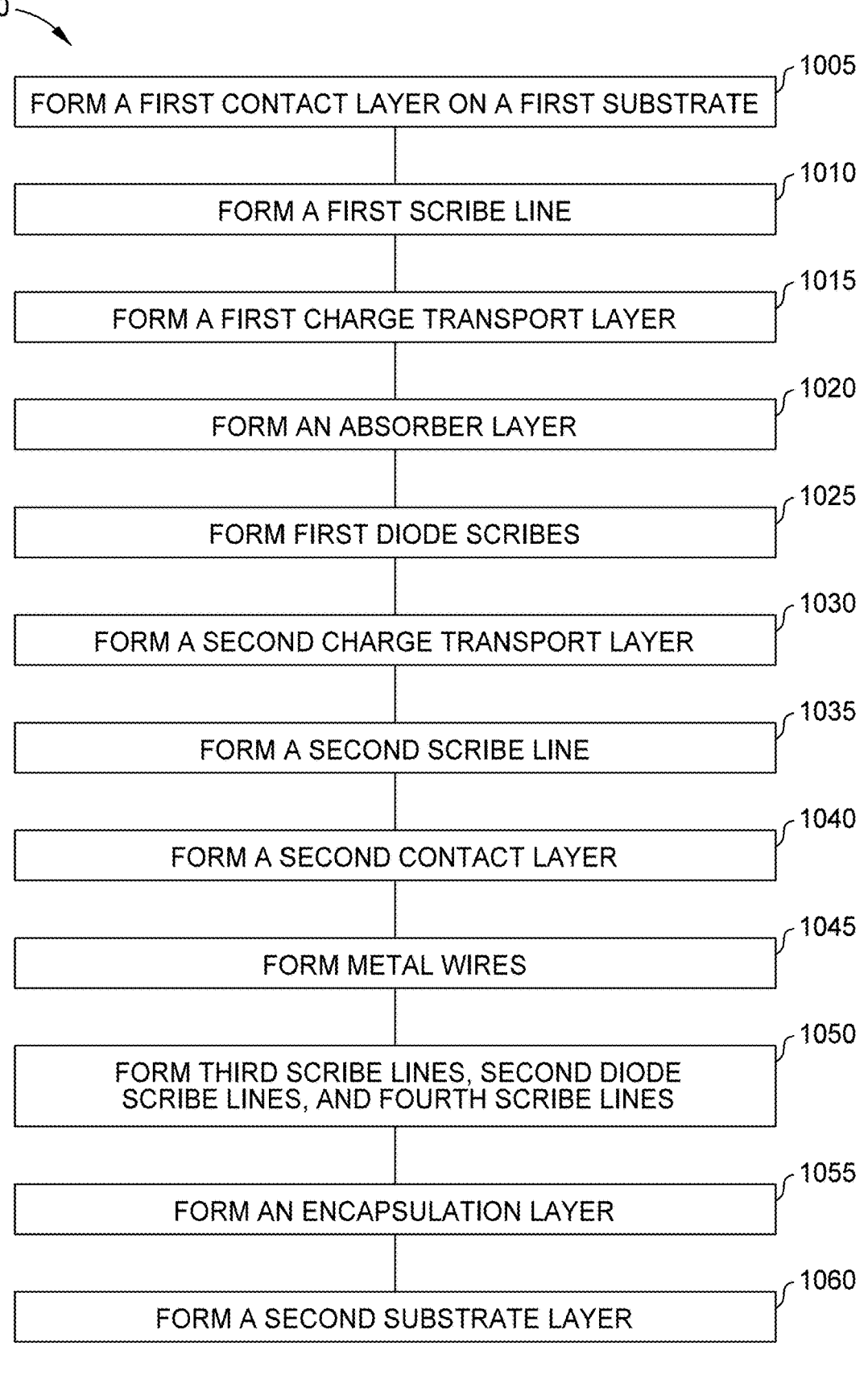

1000

FORM A FIRST CONTACT LAYER ON A FIRST SUBSTRATE — 1005

FORM A FIRST SCRIBE LINE — 1010

FORM A FIRST CHARGE TRANSPORT LAYER — 1015

FORM AN ABSORBER LAYER — 1020

FORM FIRST DIODE SCRIBES — 1025

FORM A SECOND CHARGE TRANSPORT LAYER — 1030

FORM A SECOND SCRIBE LINE — 1035

FORM A SECOND CONTACT LAYER — 1040

FORM METAL WIRES — 1045

FORM THIRD SCRIBE LINES, SECOND DIODE SCRIBE LINES, AND FOURTH SCRIBE LINES — 1050

FORM AN ENCAPSULATION LAYER — 1055

FORM A SECOND SUBSTRATE LAYER — 1060

FIG. 10

THIN FILM PHOTOVOLTAIC MODULES WITH PERIMETER BYPASS DIODES

CROSS-REFERENCE TO RELATED APPLICATIONS

This application claims the benefit of U.S. Provisional Application 63/544,583 filed on Oct. 17, 2023.

BACKGROUND

Field

Embodiments of the present disclosure generally relate to solar cells and methods of manufacturing thereof.

Description of the Related Art

Perovskite photovoltaic (PV) cells, also generally referred to as perovskite solar cells, have attracted attention in the solar cell industry for their high conversion efficiencies. Yet for commercialization of the technology, full modules, not just individual cells, must exhibit long term durability/stability in each installation location.

A common field failure mode for thin-film photovoltaic (PV) cells is caused by partial shading of one or more of the photovoltaic cell during operation, which can cause two different types of premature device failures. A first failure type, which is quite common to most solar technologies, is often referred to as "hot-spot generation", which can cause localized PV cell failures. A second failure more specifically problematic for perovskite is the inversion of the electrical field in the solar during a shading event, which can cause electrochemical-type failures in the perovskite absorber layer material itself. A compounding problem for perovskite PV cell containing photovoltaic panels is the difficulty of incorporating bypass diodes into the module architecture, which is partially why some PV cell manufacturers are not utilizing bypass diodes in their PV cell device structures.

Therefore, there is a need in the art for a PV cells and PV modules that can solve the problems described above.

SUMMARY

According to one or more embodiments, a photovoltaic device includes a plurality of photovoltaic (PV) cells coupled in series, wherein the plurality of PV cells include a first contact layer, a first charge transport layer (CTL layer) disposed over the first contact layer, an absorber layer disposed over the first CTL layer, a second CTL layer disposed over the absorber layer, and a second contact layer disposed over the second CTL layer, wherein the plurality of PV cells comprise a first PV cell and a second PV cell that are adjacent to one another and separated by a first scribe line, and a plurality of diodes positioned in diode regions that located on opposite edges of the plurality of PV cells, wherein the plurality of diodes are coupled in series and are configured to form a diode between adjacent PV cells of the plurality PV cells, wherein each of the plurality of diodes include a portion of the first contact layer of the first PV cell located in a first electrode region and a portion of the first contact layer of the second PV cell located in an second electrode region, the first electrode region of the first contact layer being coupled to the first PV cell and the second electrode region of the first contact layer being coupled to the second PV cell, the portion of the first contact layer of the first PV cell located in the first electrode region and the portion of the first contact layer of the second PV cell located in the second electrode region being electronically isolated from each other, a portion of the first CTL layer and the second CTL layer of the second PV cell positioned over the portion of the first contact layer of the second PV cell located in the second electrode region and a portion of the first CTL layer and the second CTL layer of the first PV cell are not included in the first electrode region, and a portion of the second contact layer of the first PV cell positioned over and in direct contact with the portion of the first contact layer of the first PV cell positioned in the first electrode region.

According to one or more embodiments, a method includes forming a first charge transport layer (CTL layer) over a patterned first contact layer, wherein the patterned first contact layer includes a first portion of a first contact layer positioned over a surface of a first substrate, a second portion of the first contact layer positioned over the surface of the first substrate, wherein a first scribe line is positioned between the first portion and the second portion, the first portion of the first contact layer comprises a first PV cell region and a first electrode region, and the second portion of the first contact layer comprises a second PV cell region and an second electrode region, forming an absorber layer over the first CTL layer, wherein the absorber layer is formed over the first PV cell region, the second PV cell region, the first electrode region, and the second electrode region, removing, by use of a scribing process, the absorber layer formed over the first electrode region and the second electrode region, forming a second CTL layer over the absorber layer of the first PV cell region and the second PV cell region, and over the first electrode region, and the second electrode region, removing, by use of a scribing process, a portion of the first CTL layer and the second CTL layer formed over the first electrode region, wherein removing the portion of the first CTL layer exposes a portion of the first contact layer within the first electrode region, depositing a second contact layer over the second CTL layer within the first PV cell, the second PV cell, and the second electrode region, and over the exposed portion of the first electrode region, removing, by use of a scribing process, a first portion of the second contact layer positioned between the first PV cell region and the second PV cell region, and removing, by use of a scribing process, a second portion of the second contact layer positioned between a portion of the first PV cell region and the first electrode region.

According to one or more embodiments, a photovoltaic device includes a plurality of photovoltaic (PV) cells coupled in series, wherein the plurality of PV cells include a first contact layer, a first charge transport layer (CTL layer) disposed over the first contact layer, an absorber layer disposed over the first CTL layer, a second charge transport layer (CTL layer) disposed over the absorber layer, and a second contact layer disposed over the second CTL layer, wherein the plurality of PV cells comprise a first PV cell and a second PV cell that are adjacent to one another and separated by a first scribe line, and a plurality of diodes positioned in diode regions located on opposite edges of the plurality of PV cells that are coupled in series, the plurality of diodes configured to couple adjacent PV cells of the plurality PV cells, wherein each of the diodes include a portion of the first contact layer of the first PV cell located in a first electrode region and a portion of the first contact layer of the second PV cell located in an second electrode region, the first electrode region being coupled to the first PV cell and the second electrode region being coupled to the second PV cell, the portion of the first contact layer of the first PV cell located in the first electrode region and the portion of the first contact layer of the second PV cell located in the second electrode region being electronically isolated from each other, a portion of the first CTL layer and the second CTL layer of the second PV cell positioned over the portion of the first contact layer of the second PV cell located in the second electrode region and a portion of the first CTL layer and the second CTL layer of the first PV cell are removed from the first electrode region, and a portion of the second contact layer of the first PV cell positioned over and in direct contact with the portion of the first contact layer of the first PV cell positioned in the first electrode region, wherein the first electrode region is electronically isolated from the first PV cell via a second scribe line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1 illustrates a photovoltaic (PV) cell device stack that includes multiple layers that may be used in a fully functioning PV cell and/or PV module.

FIG. 7B illustrates plan view of a portion of the wires of the photovoltaic device shown in FIG. 7A, according to one or more embodiments.

FIG. 7C illustrates a perspective view of a branch wire, according to one or more embodiments.

FIG. 7D illustrates a perspective view of a lateral wire, according to one or more embodiments.

FIG. 7E illustrates a perspective view of a branch wire, according to one or more embodiments.

FIG. 7F illustrates a perspective view of a lateral wire, according to one or more embodiments.

FIG. 10 illustrates a method of fabricating a portion of the photovoltaic device array of the photovoltaic device according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2A:
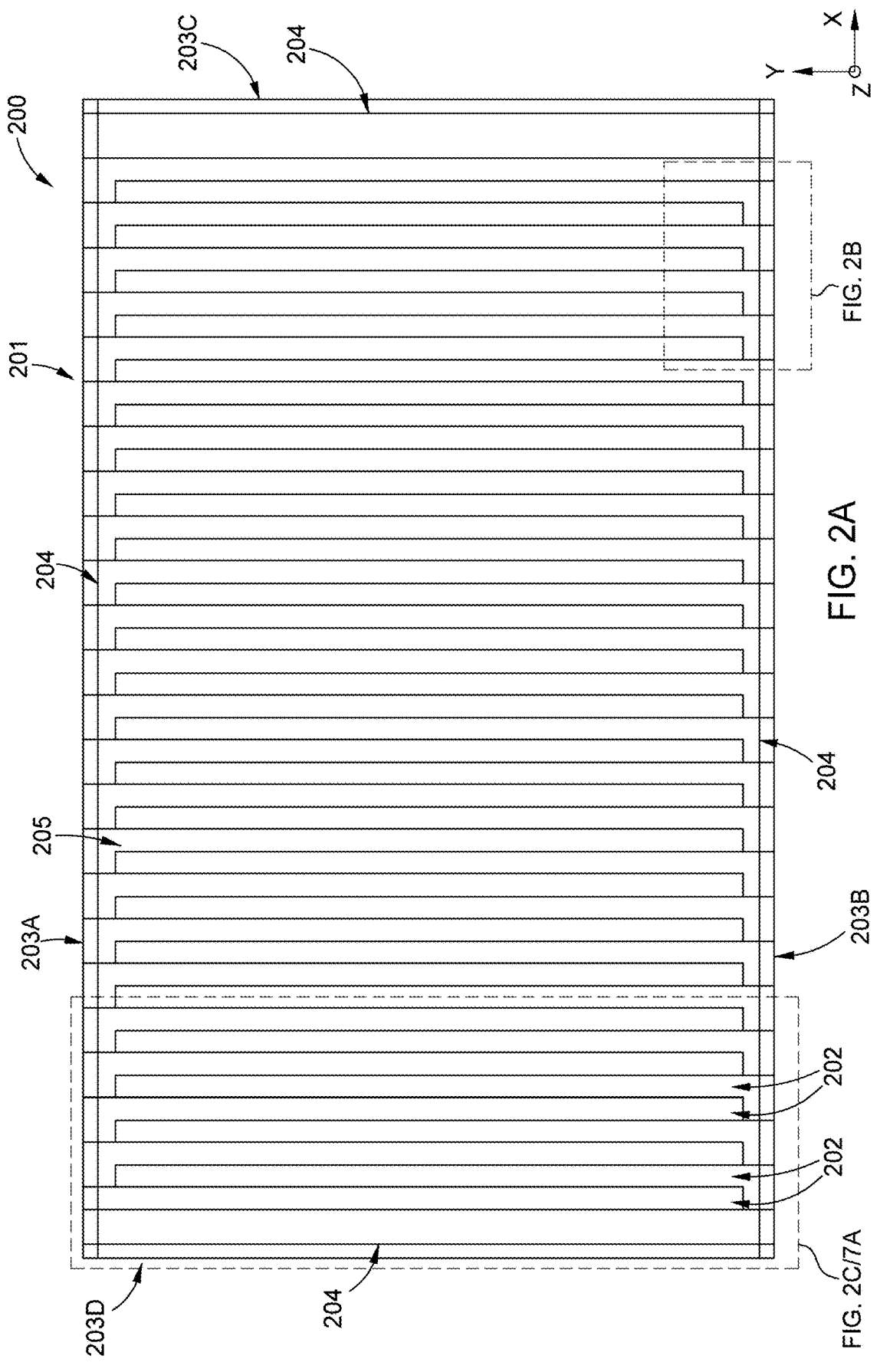
FIG. 2A illustrates a schematic plan view of a photovoltaic device according to one or more embodiments.

Perovskite photovoltaic (PV) cells are increasing in use due to their high conversion efficiencies. However, one issue that photovoltaic (PV) cells, or solar cells, in general face is premature failures due to partial shading of sun light during operation. As noted above, partial shading of a perovskite PV cell can cause local failures due to "hot-spot" generation. Partial shading of a perovskite PV cell can also cause an inversion of the electric field within the cell resulting in electrochemical-type failures in the perovskite itself.

When a multi-PV cell panel, which includes a plurality of PV cells connected in series, if one PV cell is significantly shaded from the sun, the same amount of current flowing through the connected series of PV cells is forced through that shaded PV cell. Because the shaded cell is not generating a sufficient photocurrent to supply the necessary current, the shaded PV cell has to find the extra current by switching into a negative bias. At minimal amounts of shading, PV cells may reach the needed current level through shunt pathways, limiting the magnitude of the negative voltage. However, perovskite containing PV cells/panels, as one example of a PV cell/panel, are exemplified by a high shunt resistance, so the shunt pathways are not easily accessible. At larger amounts of shading, the materials in a shaded PV cell will electrically breakdown, and thus damage the PV cell, in order to allow the necessary current to pass through the shaded PV cell.

Embodiments herein relate to device configurations and methods of incorporating thin-film diodes in series with perovskite PV cells to prevent one or more portions of a perovskite PV cell within a PV module from becoming damaged (e.g., material breakdown) during a shading event.

FIG. 1 illustrates an example of a photovoltaic device stack that includes multiple layers that may be used in a fully functioning PV cell and/or PV module. In some embodiments of the present disclosure, a photovoltaic device 100, (e.g., a PV cell) may include, in order, a first substrate layer 110, a first contact layer 120, a first charge transport layer (CTL layer) 130, an absorber layer 140 (e.g., a perovskite layer), a second charge transport layer (CTL layer) 150, a second contact layer 170, an optional one or more barrier layers 180, an encapsulation layer 190, and a second substrate layer 115. To facilitate understanding, identical reference numerals have been used, where possible, to designate identical elements that are common to the figures. It is contemplated that elements and features of one embodiment may be beneficially incorporated in other embodiments without further recitation.

Referring again to FIG. 1, the photovoltaic device 100 illustrated may include a portion of a PV cell, versus a module, in that the device shown may have no scribe lines, such that scribe lines often separate the absorber layer and/or other layers into individual cells on the module. In general, the term scribe line as used herein will include deliberate lines or channels formed in one or more materials or material layers to segment the material or material layers into smaller physically separated and in some cases electrically isolated regions within a PV cell, PV device, or module.

The photovoltaic device 100, described herein may be a multilayer, stacked device that can include p-i-n or n-i-p type configuration. In one example, a PV cell within the photovoltaic device 100 may include, in order, a first charge transport layer (CTL layer) 130 that is a hole-transport-layer (HTL), an absorber layer 140 (e.g., a perovskite layer), a second charge transport layer (CTL layer) 150 that is an electron-transport-layer (ETL), a second contact layer 170, and an optional one or more barrier layers 180. In another example, a PV cell may include, in order, a first charge transport layer (CTL layer) 130 that is an electron-transport-layer (ETL), an absorber layer 140 (e.g., a perovskite layer), a second charge transport layer (CTL layer) 150 that is a hole-transport-layer (HTL), a second contact layer 170, and an optional one or more barrier layers 180.

Photovoltaic Device Examples

FIG. 2A illustrates a schematic plan view of a photovoltaic device 200 that includes a photovoltaic device array 201 according to one or more embodiments. The photovoltaic device array 201 includes a plurality of series connected photovoltaic (PV) cells 202. The photovoltaic device array 201 includes a plurality of features, such as a plurality of first scribe lines P1 (not shown), a plurality of second scribe lines P2 (not shown), a plurality of third scribe lines 205 (also referred to herein as "third scribe lines P3") that are used to form the series connected PV cells 202, a plurality of fourth scribe lines 204 (also referred to as "fourth scribe lines P4") that are used to separate and isolate the photovoltaic device array 201 from the edge regions of the photovoltaic device 200. For example, photovoltaic device 200 includes top edge region 203A, bottom edge region 203B, left edge region 203C, and right edge region 203D. In one or more embodiments, the photovoltaic device array 201 includes by-pass diodes (referred to herein as "diodes") that each span across two adjacent PV cells 202. The diodes alternate between being formed on opposing the edges of adjacent pairs of PV cells 202 (e.g., a top edge region 203A and bottom edge region 203B of the PV cells 202). Stated otherwise, diodes are formed between the top and/or bottom edges of each of the PV cells 202 and horizontal fourth scribe lines 204 that isolate the photovoltaic device array 201 from top edge region 203A and bottom edge region 203B. In one example, the diodes are connected in series and span from the left edge region 203C to the right edge region 203D. This is shown in more detail in FIG. 2C. Although the diodes are illustrated as spanning across two adjacent PV cells 202, this is provided as an example only. In one or more embodiments, the diodes may span across any suitable quantity of PV cells 202. In one or more embodiments, the maximum quantity of PV cells 202 the diodes can span across is equal to the absolute voltage of the voltage of the PV cells 202 at reverse breakdown divided by the open circuit voltage of the PV cells 202.

Figure 2C:
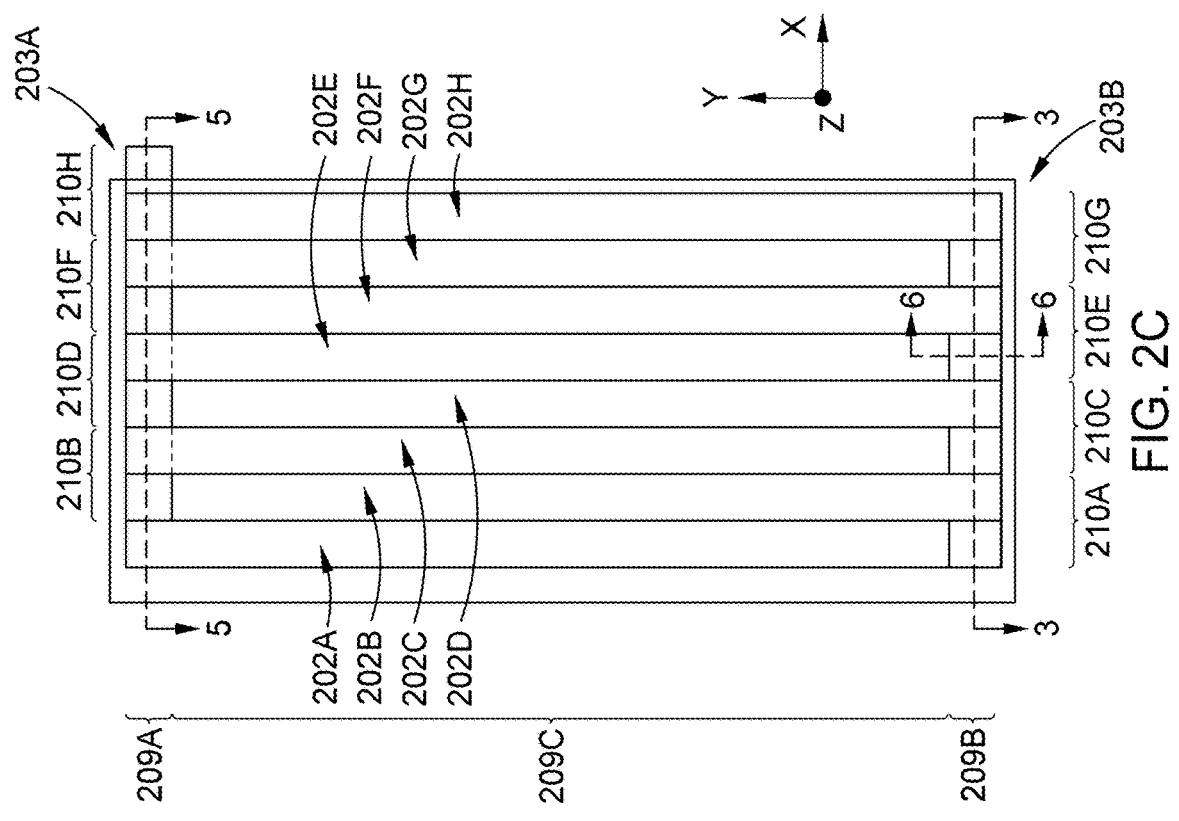
FIG. 2C illustrates a schematic plan view of a portion of the photovoltaic device as illustrated in FIG. 2A, according to one or more embodiments.
Figure 2B:
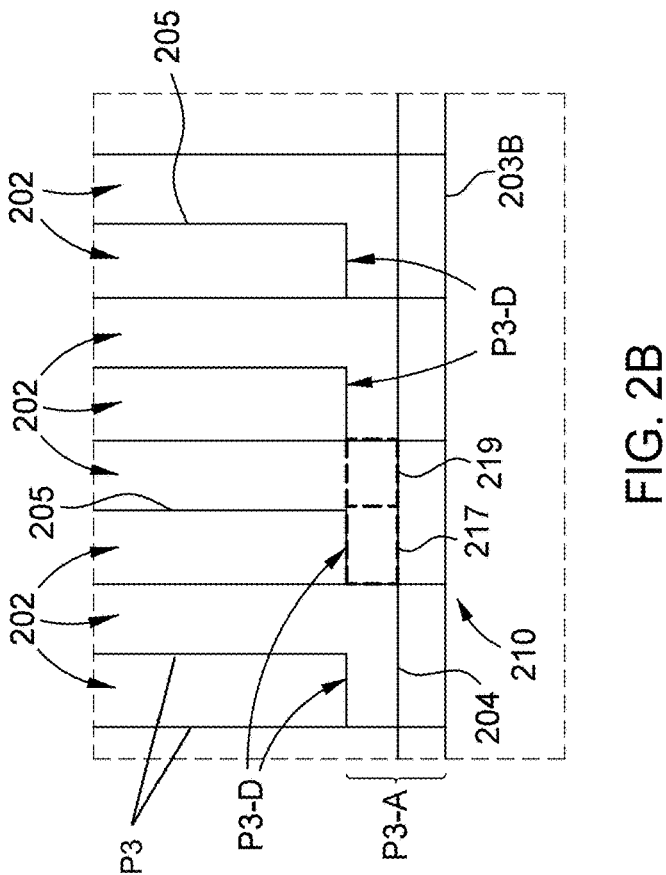
FIG. 2B illustrates a schematic plan view of a portion of the photovoltaic device as illustrated in FIG. 2A, according to one or more embodiments.

FIG. 2B illustrates a schematic plan view of a portion of the photovoltaic device 200 as illustrated in FIG. 2A, according to one or more embodiments. FIG. 2B includes a close-up view of a portion of the photovoltaic device array 201 shown in FIG. 2A. As shown in FIG. 2B, a series of diodes are, such as a diode 210, are formed between an edge (e.g., bottom edge) of each of the PV cells 202 and a horizontal fourth scribe line 204 that isolate the photovoltaic device array 201 from the bottom edge region 203B. Each of the diodes 210 extend across two adjacent PV cells 202. Each of the diodes 210 include a first electrode region 217 and a second electrode region 219. The first electrode region is formed over a first PV cell of the adjacent PV cells and the second electrode region is formed over a second PV cell of the adjacent PV cells, which is described in more detail below. In one or more embodiments, the first electrode region has a first polarity and the second electrode region has a second polarity. Depending on structure of the photovoltaic device 200 the first electrode region and second electrode region can be a cathode region and an anode region, respectively, or an anode region and a cathode region, respectively. Thus, the polarity of the first electrode region and the second electrode region are determined by the formed configuration of the photovoltaic device 200 (e.g., p-i-n or n-i-p configuration). While not intending to limit the scope of the disclosure provided herein, in the examples provided herein, the first electrode region is often referred to herein as a cathode region and the second electrode region is often referred to herein as an anode region.

FIG. 2C illustrates a schematic plan view of a portion of the photovoltaic device 200 as illustrated in FIG. 2A, according to one or more embodiments. FIG. 2C includes a first portion of the photovoltaic device array 201 shown in FIG. 2A, which, for discussion purposes, includes eight PV cells 202A-202H. The photovoltaic device 200 includes diodes (i.e., by-pass diodes) that are formed on alternating edges of the PV cells 202. In one or more embodiments, the PV cells 202 are located within a PV cell region 209C that is disposed between the diode regions 209A and 209B. In one or more examples, the diodes (diode regions) are located between the top and bottom edges of the PV cells 202 (i.e., the PV cell region 209C) and the top edge region 203A and the bottom edge region 203B, respectively. Stated otherwise, diodes are formed between the PV cells 202 and the fourth scribe lines P4 or an edge of the photovoltaic device 200 if the fourth scribe lines P4 is not present.

Figures 3, 4:
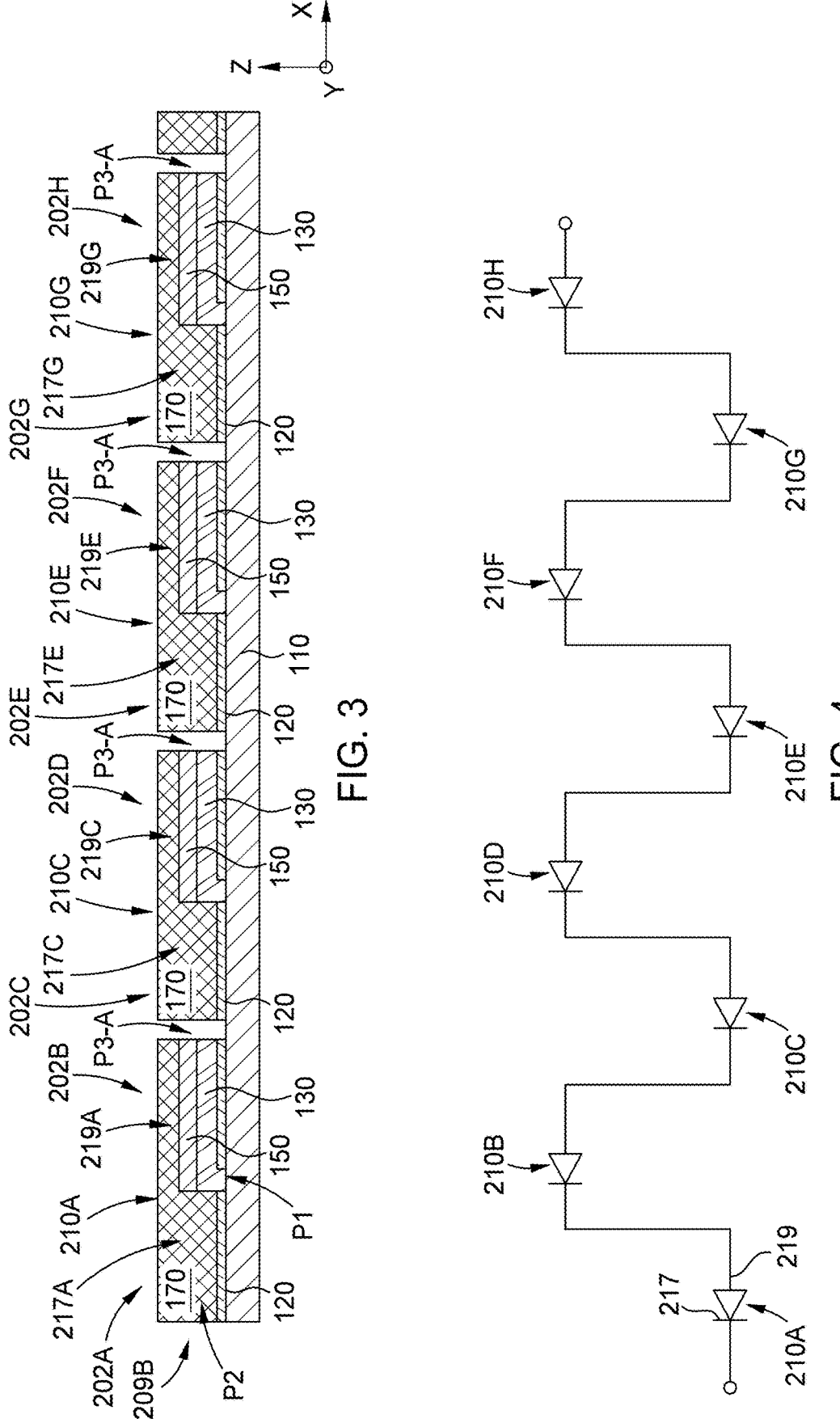
FIG. 3 illustrates a schematic side cross-sectional view of a first portion of the photovoltaic device illustrated in FIG. 2C, according to one or more embodiments.
FIG. 4 illustrates an electrical schematic of the diodes formed in a second portion of the photovoltaic device illustrated in FIG. 2C, according to one or more embodiments.

FIG. 3 illustrates a side cross-sectional view of a first portion of the photovoltaic device array 201, which includes a sectioned portion of the photovoltaic device array 201 (i.e., the diode region 209B) formed by the sectioning line 3-3 shown in FIG. 2C. The sectioned portion of the photovoltaic device array 201 includes a plurality of features, such as the first scribe lines P1, the second scribe lines P2, and second diode scribe lines P3-A, as described further below.

Figures 5, 6:
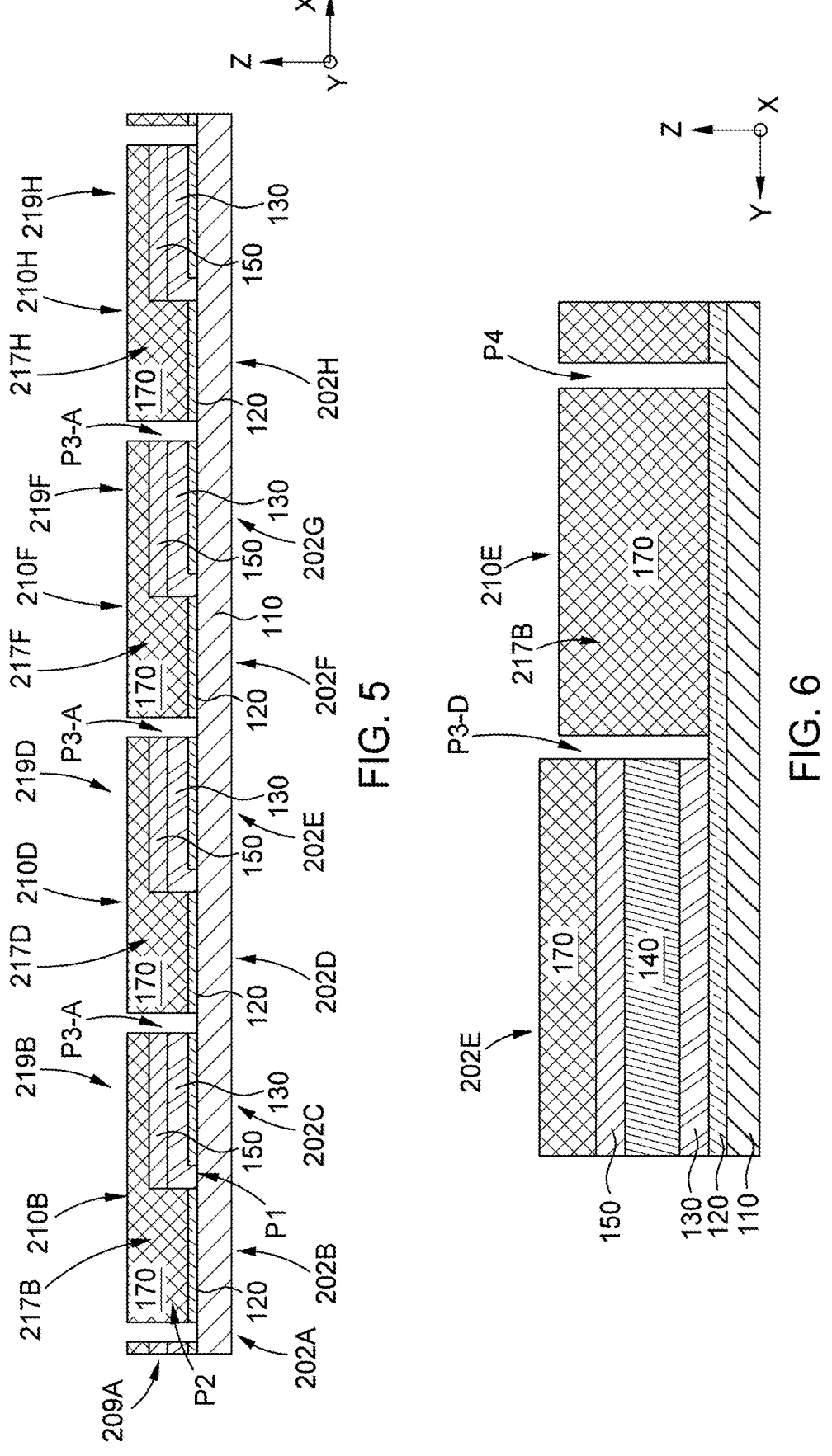
FIG. 5 illustrates a schematic side cross-sectional view of a third portion of the photovoltaic device illustrated in FIG. 2C, according to one or more embodiments.
FIG. 6 illustrates a schematic side cross-sectional view of a fourth portion of the photovoltaic device illustrated in FIG. 20, according to one or more embodiments.

FIG. 5 illustrates a side cross-sectional view of a second portion of the photovoltaic device array 201, which includes a sectioned portion of the photovoltaic device array 201 (i.e., the diode region 209A) formed by the sectioning line 5-5 shown in FIG. 2C. The sectioned portion of the photovoltaic device array 201 includes the plurality of features, such as the first scribe lines P1, the second scribe lines P2, and the second diode scribe lines P3-A, as described further below.

Referring to FIG. 2C, the illustrated portion of the photovoltaic device array 201 includes PV cells 202A-202H, a diode region 209A, and a diode region 209B that are each located on opposite edges of PV cells 202A-202H. In this example, the diode region 209A is formed between the top edges of PV cells 202A-202H and a horizontal fourth scribe line P4. The diode region 209B, in this example, is formed between the bottom edges of PV cells 202A-202H and a horizontal fourth scribe line P4. The diode regions 209A and 209B each include diodes that are coupled to adjacent PV cells. The series connection of the diodes through portions of the PV cells alternate between a diode formed in the diode region 209A and a diode formed in the diode region 209B.

Referring to FIGS. 2C and 3, a diode 210A, a diode 210C, a diode 210E, and a diode 210G are all formed in the diode region 209B. Diode 210A is coupled to PV cells 202A and 202B, diode 210C is coupled to PV cells 202C and 202D, diode 210E is coupled to PV cells 202E and 202F, and diode 210G is coupled to PV cells 202G and 202H. As shown, diodes 210A, 210C, 210E and 210G are formed between the bottom edge of PV cells and a horizontal fourth scribe line P4.

Referring to FIGS. 2C and 5, a diode 210B, a diode 210D, a diode 210F, and a diode 210H are all is formed in the diode region 209A. Diode 210B is coupled to PV cells 202B and 202C, diode 210D is coupled to PV cells 202D and 202E, diode 210F is coupled to PV cells 202F and 202G, and diode 210H is coupled to PV cells 202H and an adjacent PV cell (not shown). As shown, diodes 210B, 210D, 210F and 210H are formed between the top edge of PV cells and a horizontal fourth scribe line P4.

Although FIG. 2C illustrates 8 PV cells 202A-202H and 8 diodes 210A-210H, the quantity of PV cells and diodes within a photovoltaic device 200 are not limited. The photovoltaic device 200 may include any suitable quantity of PV cells and corresponding diodes. In some embodiments, diodes are formed serially on alternating sides (diode regions 209A and 209B) of each adjacent set of PV cells which are formed between the left edge region 203C and the right edge region 203D.

FIG. 4 illustrates an electrical schematic of the diodes formed in a second portion of the photovoltaic device illustrated in FIG. 2C which includes the 8 PV cells 202A-202H and 8 diodes 210A-210H. As illustrated in FIG. 4, the diodes 210A-210H are coupled in series with the second electrode region 219 (e.g., anode region) of each diode coupled to the first electrode region 217 (e.g., cathode region) of each successive diode (or vice versa). For example, the second electrode region 219A of diode 210A is coupled to the first electrode region 217B of diode 210B and so on. This is also described in more detail below. As noted above, the diodes alternate from being formed between a PV cell 202 and top edge region 203A and between a PV cell 202 and bottom edge region 203B (or vice versa).

As will be discussed in the method steps provided below, each of the diodes 210 and PV cells 202 are simultaneously formed. In some embodiments, the second electrode regions 219 of the diodes 210 will include all the layers of the PV cells 202 with the exception of the absorber layer 140. For example, the second electrode region 219 can include the first contact layer 120, the first CTL layer 130 disposed over the first contact layer 120, the second CTL layer 150 disposed over the first CTL layer 130, and the second contact layer 170 disposed over the second CTL layer 150. The first electrode region 217A within each of the diodes 210 includes the first contact layer 120 and the second contact layer 170, which, in some embodiments, is disposed over and in direct contact with the first contact layer 120.

Referring to FIGS. 3-5, the diode 210A includes a first electrode region 217A that forms a cathode region and a second electrode region 219A that forms an anode region (or vice versa). In one or more embodiments, the first electrode region 217A may form the cathode and the second electrode region may form the anode. The first electrode region 217A is coupled to a first PV cell of the adjacent pairs of PV cells. The second electrode region 219A is coupled to the second PV cell of the adjacent pairs of PV cells. The second electrode region 219A is further coupled to a first electrode region 217B of a diode that is formed in diode region 209A, which is formed near the top edge region 203A. For example, diode 210A includes a first electrode region 217A coupled to PV cell 202A and a second electrode region 219A coupled to PV cell 202B. The second electrode region 219A coupled to PV cell 202B is coupled to a first electrode region 217B of diode 210B that is coupled to the PV cell 202B. In a similar manner diodes 210B-210H each include a respective first electrode regions 217B-217H and second electrode regions 219B-219H.

FIG. 6 illustrates a side cross-sectional view of a portion of the photovoltaic device array 201, which includes a sectioned portion of the photovoltaic device array 201 formed by the sectioning line 6-6 shown in FIG. 2C. The sectioned portion of the photovoltaic device array 201 shown in FIG. 6 illustrates a portion of the PV cell 202E and a corresponding portion of diode 210E (the first electrode region 217A of diode 210E) coupled to the PV cell 202E (within diode region 209B). The sectioned portion of the photovoltaic device array 201 shown in FIG. 6 further illustrates a configuration of a plurality of features, such as a third scribe line P3 and a fourth scribe line P4. During the second scribe line P2 formation process the first electrode regions 217A/217B of a diode 210 are formed by removing all of the layers formed on the first contact layer 120. A portion of the third scribe line P3 is used to isolate the portion of the second contact layer 170 included within the diode 210E (the first electrode region 217E of the diode 210E) from the second contact layer 170 of the PV cell 202E, allowing current to flow from the second electrode region 219E of the diode 210E that is coupled to PV cell 202F to the first electrode region 217E of the diode 210E that is coupled to the first contact layer 120 of the PV cell 202E to allow the diode 210E to by-pass the current when at least a portion of the PV cell 202F is in reverse bias (e.g., a shading event).

Figure 7A:
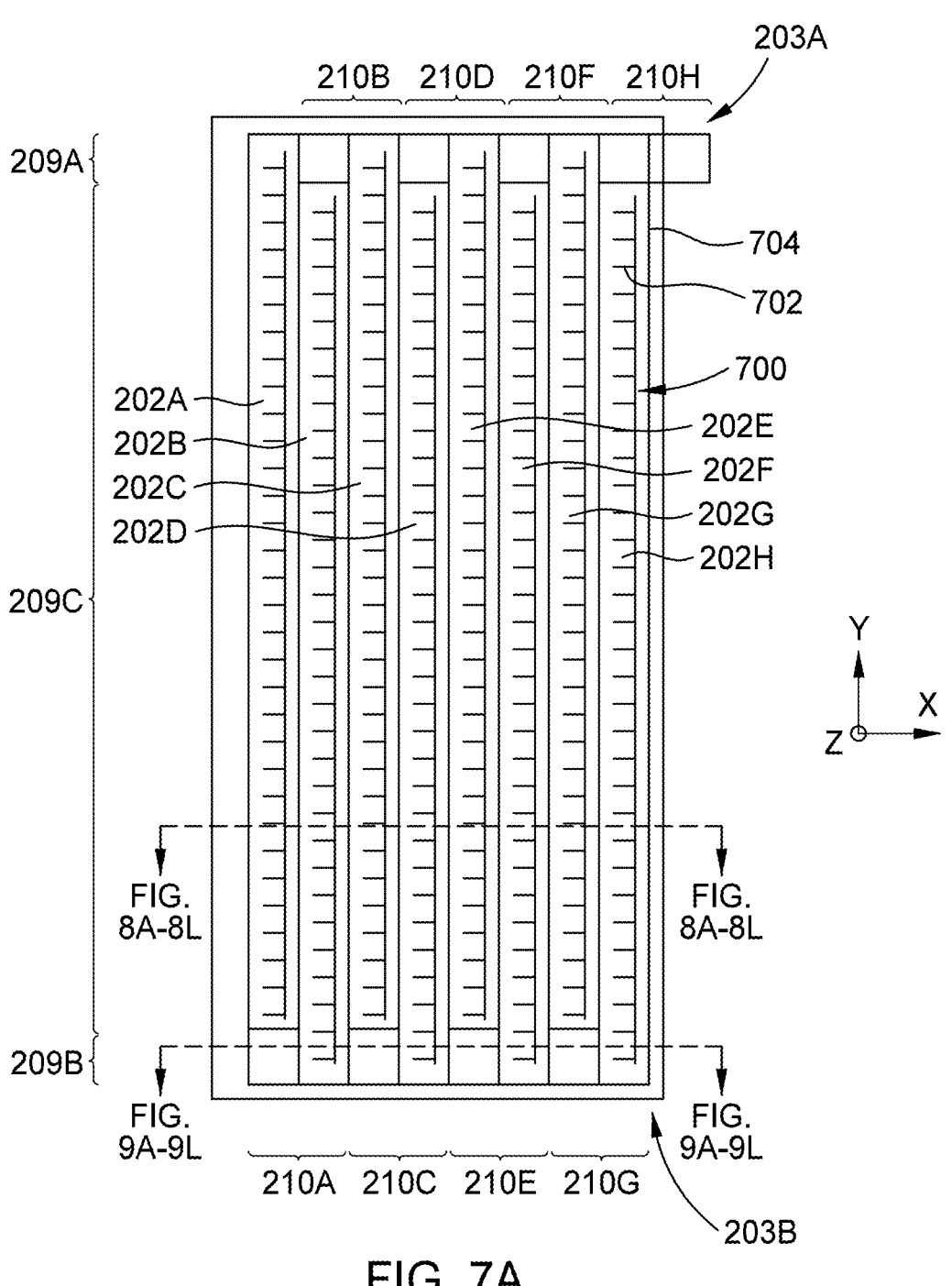
FIG. 7A illustrates a schematic plan view of a portion of the photovoltaic device as illustrated in FIG. 2A, according to one or more embodiments.

FIG. 7A illustrates a schematic plan view of a portion of the photovoltaic device 200 as illustrated in FIG. 1A, according to one or more embodiments. FIG. 7A includes a sectioned portion of the photovoltaic device array 201 shown in FIG. 2A. As shown in FIG. 7A the photovoltaic device 200 further includes wires 700 that are formed in a grid-like fashion across the PV cells formed in the photovoltaic device array 201. In one or more embodiments, the wires are formed on the second contact layer 170 of the photovoltaic device 200. FIG. 7B is a close up plan view of a portion of the wires 700 of the photovoltaic device shown in FIG. 7A. In one or more embodiments, the wires include branch wires 702 and lateral wires 704. In one or more examples, the wires 700 are a conductive material such as a metal material including, but not limited to, a discrete wire, a conductive ribbon, or a layer of material that can include a metal such as silver, copper, chromium, or other useful conductive material. As understood by those with ordinary skill in the art the branch wires 702 are configured to improve the lateral conductance of the second contact layer 170 within each PV cell 202 to improve the delivery of a generated photovoltaic current between PV cells 202 and, in cases where shading one or more PV cells has occurred, the delivery of the extra current generated by the negative bias to the diode 210 to prevent or minimize the amount of damage to the material within the shaded PV cell. In one or more embodiments, the photovoltaic current is directed, left-to-right, from PV cell 202A to PV cell 202H (or vice versa). The lateral wires 704 are configured to improve the coupling of the PV cells 202 to the second electrode region 219B of their corresponding diode 210. For example, the lateral wires 704 direct a current from a partially shaded PV cell 202D (partial shading not shown) to the diodes 210C to prevent or minimize the amount of damage to the material within the shaded PV cell 202D.

In one or more embodiments, the wires 700 may be formed by screen printing, lithographic patterning technics, sputtering using a patterned mask, or other useful deposition technique. For example, the wires 700 may be screen printed onto the second contact layer 170 and then a heat treatment type of burn-off process may be used to remove any remaining binding material used in the screen printing process to form conductive wires. In other embodiments, the wires 700 may be discrete wires that are physically installed into the second contact layer 170. In yet another embodiment, the wires 700 can be installed by bonding a pre-patterned conductive material that includes a conductive adhesive to the surface of the second contact layer 170. For example, a silver and/or copper containing layer of metal is formed on a removable material, such as a plastic sheet, and then the pre-patterned conductive material is bonded to the second contact layer 170 via a conductive adhesive. Then after bonding the pre-patterned conductive material to the surface of the second contact layer 170, the removable material is removed from the bonded wires 700 that are bonded to the surface of the second contact layer 170 via the conductive adhesive. In yet another embodiment, the wires 700 can be formed by use of an inkjet or aerosol jet deposition process.

As understood by those with ordinary skill in the art, to facilitate current flow through the photovoltaic device array 201, the wires 700 should have a minimal resistivity (i.e., ohms per centimeter (Ω/cm)). However, at the same time, the coverage by the wires 700 within the photovoltaic device array 201 should be minimized to reduce the amount of light that is blocked from reaching the absorber layer 140 due to the presence of the wires 700, and/or, in a tandem PV cell configuration, reduce the amount of light that is blocked from reaching an array of solar cells that are positioned to receive the light that has passed through the photovoltaic device 200. In one or more embodiments, the area of coverage of the wires 700 of the photovoltaic device array 201 is from about 1% to about 5% of the total area, for example from about 1% to about 2% of the total area. In one or more embodiments, the electrical resistance of the formed wires can be reduced while minimizing coverage by changing the aspect ratio (dimensions) of the wires 700, such as increasing the thickness of the wires 700 in a direction that is normal to the sun light receiving surface of the PV cell (i.e., Z-direction) versus the width of the formed wires 700 in a direction that is parallel to the sun light receiving surface of the PV cells (i.e., X or Y-directions).

FIG. 7B illustrates isometric view of a portion of the wires 700 of a selected portion of the photovoltaic device shown in FIG. 7A. The current carrying ability, or resistance to current flow through the wires 700, is dependent on the length and cross-sectional area of the branch wires 702 and the lateral wire 704. The cross-sectional area of the branch wires 702 is defined by dimension 714 (i.e., lateral dimension) and the thickness of the branch wire 702 in the direction normal to the sunlight receiving surface (i.e., Z-direction). The branch wires 702 will each include a length dimension 712. The cross-sectional area of the lateral wires 704 is defined by dimension 718 (i.e., lateral dimension) and the thickness of the lateral wire 704 in a direction normal to the sunlight receiving surface (i.e., Z-direction). The lateral wire 704 will include a length dimension 716. As shown in FIG. 7B, the branch wires 702 have a dimension 712 formed in the X-direction and a dimension 714 formed in the Y-direction. The dimension 712 may be from about 1 millimeter to about 10 millimeters, and the dimension 714 may be from about 1 micrometer to about 100 micrometers. Similarly, the lateral wires 704 have a dimension 718 formed along the x-axis and a dimension 716 formed along the y-axis. The dimension 716 may be from about 1 centimeter to about 2 meters, and the dimension 718 may be from about 1 micrometer to about 250 micrometers. In one or more examples, to reduce the resistance while minimally effecting the coverage of the wires 700, the dimension 714 of the branch wires 702 and the dimension 718 of the lateral wires 704 may decrease along the length of the wire 700. Stated differently, while current is generated in a spatially uniform way, but then travels from left-to-right across the photovoltaic device array 201, there is less current in a region of the second contact layer 170 on the left side of a PV cell 202 than on the right of a PV cell 202. Therefore, the wires 700 can have a dimension that spatially varies, such as the dimension 714 (i.e., lateral dimension) of one or more of the branch wires 702 may increase from a first end that is positioned at a distance from the connection point of the branch wire 702 and the lateral wire 704 and a second end that positioned at the connection point of the branch wire 702 and the lateral wire 704, and/or the dimension 718 (i.e., lateral dimension) of the lateral wire 704 may increase from a first end that is positioned at a distance from the first electrode region 217B of a first diode 210 and a second end positioned at or over the second electrode region 219B of a second diode 210. In one or more examples, the wires 700 may have any suitable cross sectional shape taken using a vertical plane (e.g., sun light receiving direction) such as a triangle, a circle, an oval, a trapezoid, or the like. In one or more embodiments, the wires 700 have a cross-sectional shape and dimensions so that the wires have a resistivity from about 1 Ohm/cm to about 10 Ohm/cm, for example 5 Ohm/cm.

FIG. 7C illustrates a perspective view of a branch wire 702a of the branch wires 702, according to one or more embodiments. As shown in FIG. 7C, the branch wire 702a has a triangular cross-sectional shape and further includes a dimension 720 along the z-axis, which is positioned in a direction that is normal to the sun light receiving surface of the photovoltaic device 200. Advantageously, as described above, to reduce the resistance of the branch wires 702 while minimizing coverage, the triangular cross-sectional shape of the branch wire 702a can be used. For example, the triangular cross-section of the branch wire 702a may have an angle θ from about 30 degrees to about 60 degrees so as to minimize the lateral dimension (Y-direction) of the branch wire 702a.

FIG. 7D illustrates a perspective view of a lateral wire 704a of the lateral wires 704, according to one or more embodiments. As shown in FIG. 7D, the lateral wire 704a has a triangular cross-sectional shape and further includes a dimension 722 along the z-axis, which is also positioned in a direction that is normal to the sun light receiving surface of the photovoltaic device 200. Advantageously, in a similar manner as described above, to reduce the resistance of the lateral wires 704 while minimizing coverage, the triangular cross-sectional shape of the lateral wire 704a is used. For example, the triangular cross-section of the lateral wire 704a may have an angle ∅ from about 10 degrees to about 60 degrees, such as about 15 degrees to about 45 degrees, so as to minimize the lateral dimension (X-direction) of the lateral wire 704a.

FIG. 7E illustrates a perspective view of a branch wire 702a, according to one or more embodiments. As shown in FIG. 7E, the branch wire 702 has a circular cross-sectional shape. In one embodiment, the dimension 714 along the y-axis and the dimension 722 along the z-axis are equal and correspond to the diameter of the circular cross-sectional shape. In another embodiment, the dimension 714 along the Y-axis and the dimension 722 along the z-axis are configured to be different. In one example, the dimension 722 in greater than the dimension 714 so as to maintain a desired current carrying capability of the branch wire 702a while reducing the shadowing effect created by the presence of the branch wire 702a over the light receiving surface of the PV cell it is disposed over.

FIG. 7F illustrates a perspective view of a lateral wire 704a, according to one or more embodiments. As shown in FIG. 7F, the vertical wire 704a has a circular cross-sectional shape. In one embodiment, the dimension 718 along the y-axis and the dimension 724 along the z-axis corresponds to the diameter of the circular cross-sectional shape. In another embodiment, the dimension 718 along the X-axis and the dimension 724 along the Z-axis are configured to be different. In one example, the dimension 724 in greater than the dimension 718 so as to maintain a desired current carrying capability of the lateral wire 704a while reducing the shadowing effect created by the presence of the lateral wire 704a over the light receiving surface of the PV cell it is disposed over.

Example Method for Forming a Photovoltaic Device

FIG. 10 illustrates a method 1000 of fabricating a portion of the photovoltaic device array 201 of the photovoltaic device 200 according to one or more embodiments. FIGS. 8A-8L illustrate schematic cross-sectional views of a portion 800 of the PV cell region 209C of the photovoltaic device 200 as viewed by the sectioning line 8A-8L in FIG. 7A during various stages of the fabrication of the photovoltaic device 200 which relate to the operations found in method 1000 illustrated in FIG. 10. FIGS. 9A-9L illustrate schematic cross-sectional views of a portion 900 of the diode region 209B photovoltaic device 200 as viewed by the sectioning line 9A-9L in FIG. 7A during various stages of the fabrication of the photovoltaic device 200 which also relate to the operations found in method 1000 illustrated in FIG. 10. Stated otherwise, FIGS. 8A-8L illustrate schematic views of portions of PV cells 202 and FIGS. 9A-9L schematic views of a corresponding portion of a diode region (e.g., diode region 209B). It is understood that the operations found in method 1000 are performed across the photovoltaic device array 201 to form each of the PV cells 202 and corresponding diodes 210. In some embodiments, as noted above, the diodes 210 and the PV cells 202 are fabricated simultaneously.

Figures 8A, 8B, 8C, 8D, 8E:
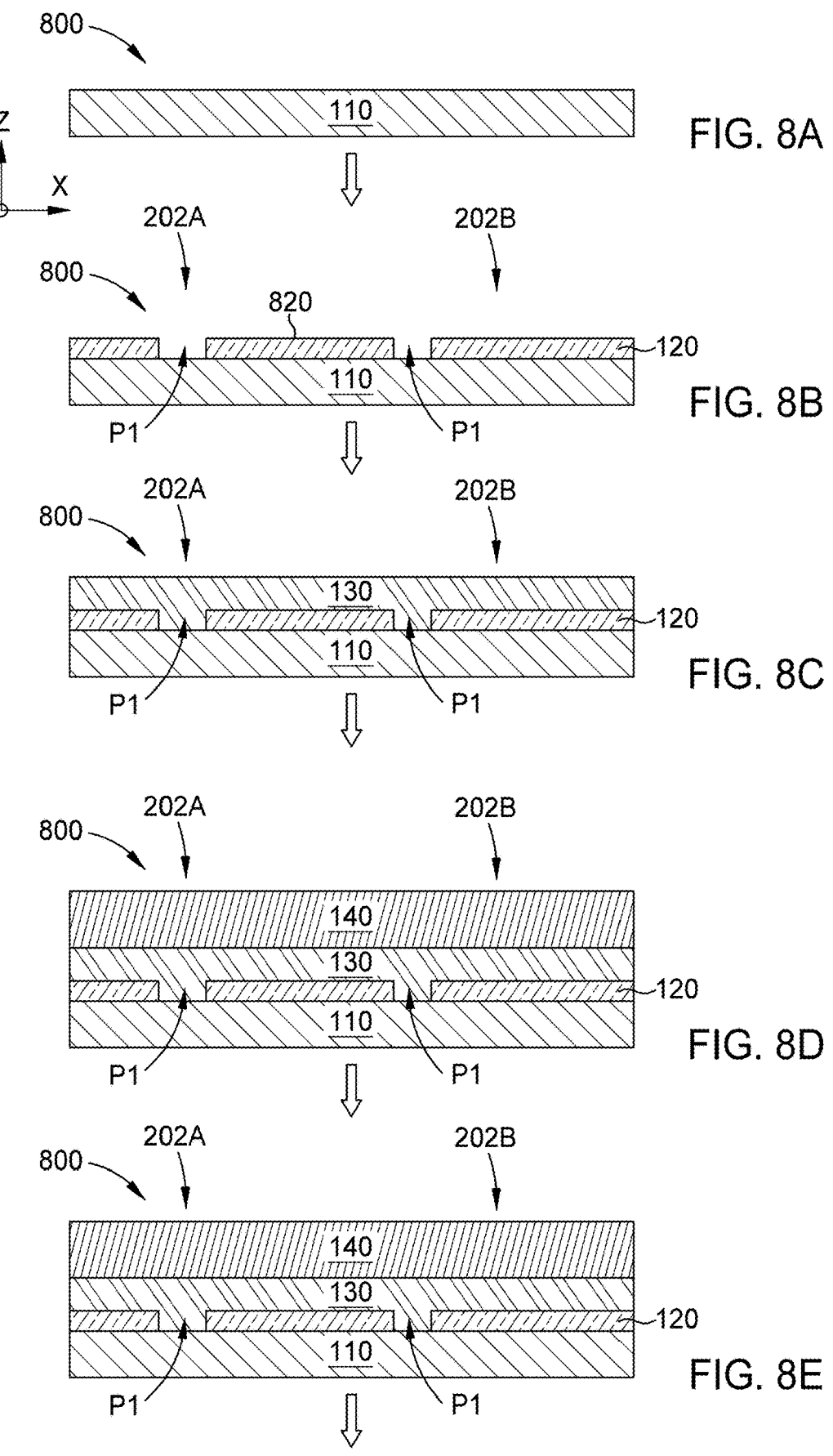
FIGS. 8A-8L illustrate schematic cross-sectional views of a portion of the photovoltaic device array during various stages of the fabrication of the photovoltaic device which relate to the operations found in the method illustrated in FIG. 10 according to one or more embodiments.
Figures 9A, 9B, 9C, 9D, 9E:
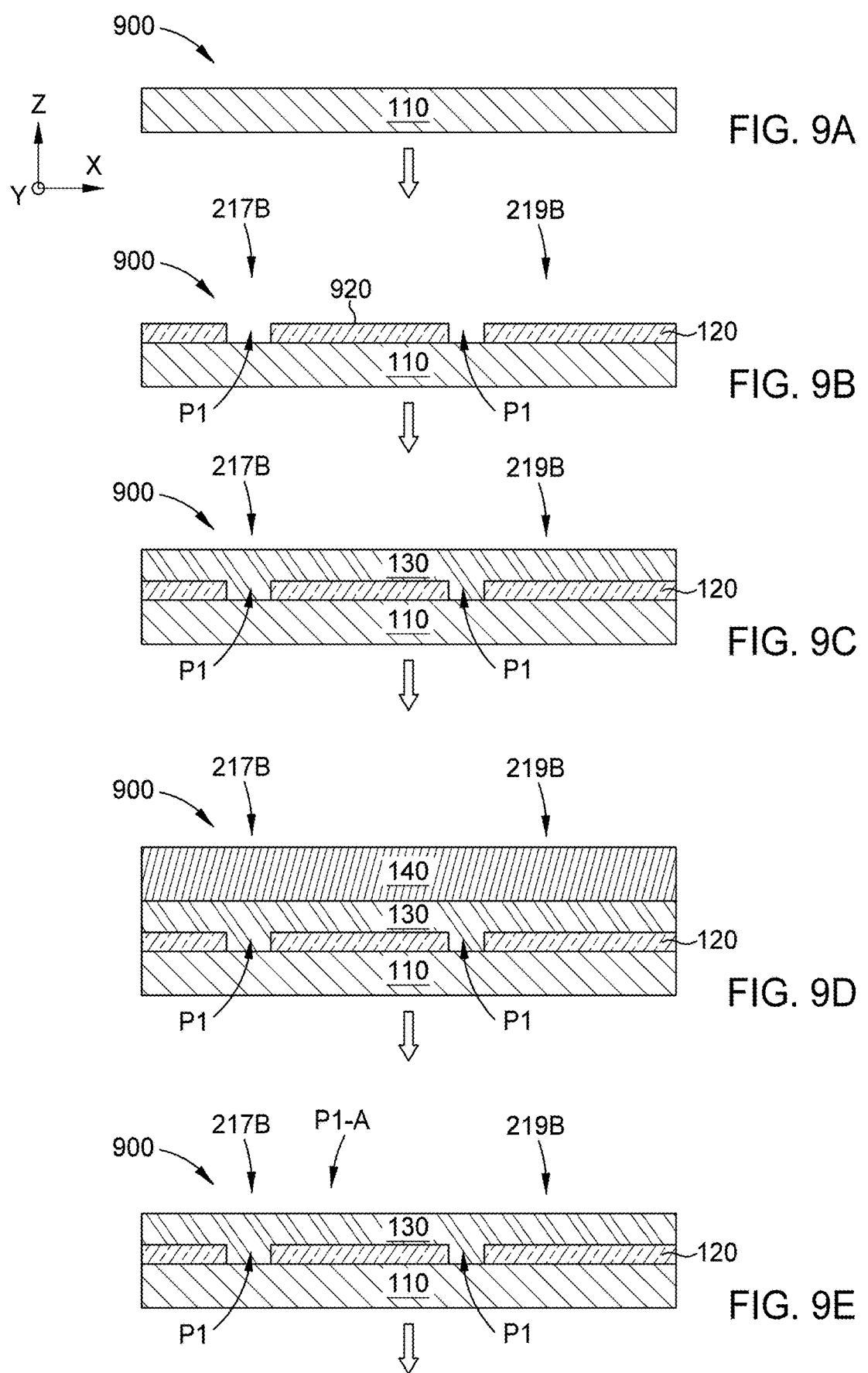
FIGS. 9A-9L illustrate schematic cross-sectional views of a portion of the photovoltaic device array during various stages of the fabrication of the photovoltaic device which relate to the operations found in the method illustrated in FIG. 10 according to one or more embodiments.

Referring to FIGS. 8A and 9A, the portion 800 and the portion 900 each include the first substrate layer 110. The first substrate layer 110 has a first substrate thickness in the Z-direction that is between about 50 μm to about 10 mm. In some embodiments, the first substrate layer 110 can include one or more materials selected from a group that includes a metal foil, silicon, glass, and/or a polymer substrate. In some embodiments, the first substrate layer 110 can include glass with a thickness between about 1 and 5 mm, more preferably between 2 and 3.2 mm. In some embodiments, the first substrate layer 110 can include metal foil and/or a polymer with a thickness between about 50 μm and 500 μm, more preferably between 40 μm and 150 μm. The first substrate layer 110 can include a roughened surface on which the various layers of the photovoltaic device stack are to be formed, wherein the roughened surface has a peak-to-valley roughness between about 1 nm to about 10 μm. For example, a peak-to valley roughness is about 1 micrometer (μm).

As illustrated in FIGS. 8B and 9B, at operation 1005 of the method 1000, the first contact layer 120 is formed on a first surface of the first substrate layer 110. The first contact layer is formed across the photovoltaic device array 201 in a blanket deposition. Thus, the first contact layer 120 is formed over the first substrate layer 110 in the portion 800 and the portion 900. The first contact layer 120 includes an electrical contact layer material. The electrical contact layer material may include any suitable material, including, but not limited to, copper, silver, gold, indium tin oxide (ITO), fluorine doped tin oxide (FTO), indium zinc oxide (IZO), aluminum zinc oxide (AZO), or any combination thereof. In one example, the first contact layer 120 includes a transparent conductive oxide (TCO) layer, such as indium tin oxide (ITO), fluorine doped tin oxide (FTO), indium zinc oxide (IZO), or aluminum zinc oxide (AZO). In some embodiments, the first contact layer 120 may have include one or more layers, where each layer of the plurality of layers includes a conductive material layer, such as a transparent conductive oxide layer. The first contact layer 120 can have a first contact thickness in the Z-direction between about 5 nanometers (nm) to about 900 nm, such as 100-300 nm, or about 150 nm. The first contact layer 120 may be formed by any suitable process including, but not limited to a physical vapor deposition (PVD) process (e.g., sputtering or evaporation processes), a chemical vapor deposition (CVD) process, plasma enhanced chemical vapor deposition (PECVD) process, an atomic layer deposition (ALD) process, a plasma enhanced atomic layer deposition (PEALD) process, or other suitable deposition technique.

At operation 1010, as shown in FIGS. 8B and 9B, the first contact layer 120 is patterned by performing a first scribing process in which first scribe lines P1 are formed in the first contact layer 120. The first scribe lines P1 are formed so that each P1 scribe extends through the first contact layer 120. The first scribe lines P1 forms electrically isolated regions of the first contact layer that are each bounded in the X-direction by the first scribe lines P1. Each of the electrically isolated regions include portions of the first contact layer 120 that are in disposed within each PV cell 202 (e.g., two portions illustrated within portion 800) and a diode within diode regions 209A and 209B, which includes the portion 900 formed with the diode region 209B.

As shown in FIG. 8B, the first scribe line P1, which extends in the +Y and −Y-directions, divides the first contact layer 120 of the portion 800 into separate electrically isolated regions 820. The electrically isolated regions 820 form the basis of the structure of a first PV cell (e.g., PV cell 202A) and a second PV cell (e.g., PV cell 202B). Although the first PV cell is referred to, in this example, as PV cell 202A and the second PV cell is referred to as PV cell 202B this is for ease of discussion purposes only. In general, the electrically isolated regions 820 will each include a portion that will form part of the PV cell region 209C, a portion that will form a first electrode region 217B at one end, and a portion that will form a second electrode region 219B at an opposing end.

As shown in FIG. 9B, the first scribe line P1 divides the first contact layer 120 of the portion 900 into separate electrically isolated regions 920. The electrically isolated regions 920 form the basis of the structure of a first electrode region 217B of a diode (e.g., diode 210A) located over PV cell 202A and a second electrode region 219B of the diode located over PV cell 202B. Stated differently, the first scribe lines P1 electrically isolate the portion of the first contact layer 120 of the PV cell 202A formed in the first electrode region 217B from the portion of the first contact layer 120 of the PV cell 202B formed in the second electrode region 219B. Although the diode is referred to as diode 210A this is for ease of discussion purposes only.

The first scribe lines P1 can include a plurality of scribe lines that are spaced apart in a parallel relationship in a first direction (e.g., X-direction). The first scribe line P1 may be formed by any suitable process, including, but not limited to, mechanical scribing systems, laser ablation, or combination thereof.

As shown in FIGS. 8C and 9C, at operation 1115, a first charge transport layer (CTL layer) 130 is formed over the patterned first contact layer 120. The first CTL layer is formed using a blanket deposition process over the portions of the first contact layer 120 and first surface of the first substrate layer 110 of the photovoltaic device array 201. The first CTL layer 130 is disposed over the patterned portions of the first contact layer 120, the exposed sidewall surfaces of the first scribe lines P1, and the exposed portion of the first substrate layer 110 in the portion 800 and the portion 900. The first CTL layer 130 has a first CTL layer thickness in the Z-direction that is between about 0.1 nm to about 10 μm, preferably between about 1 to 100 nm, more preferably between 10 to 70 nm. The first CTL layer 130 may be formed by any suitable process including, but not limited to a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., evaporation process), or other suitable deposition technique. In some embodiments, the first charge transport layer (CTL layer) 130 fills, or at least partially fills the first scribe lines P1.

In some embodiments, the first CTL layer 130 may be configured to act as a hole transport layer (HTL) including a hole transport material, or to act as an electron transport layer (ETL) including an electron transport material. In some embodiments, the first CTL layer 130 may include a plurality of layers, where each layer of the plurality of layers may include a different material dependent upon the configuration (e.g., HTL versus ETL) of the first CTL layer 130. The first CTL layer 130 is an HTL that includes, but are not limited to, PTAA, Poly-TPD, nickel oxide, molybdenum oxide, OMATD, self-assembled monolayers (SAM), [2-(9H-carbazol-9-yl)ethyl]phosphonic acid (2PACz), (2-(3,6-Dimethoxy-9H-carbazol-9-yl)ethyl)phosphonic acid (MeO-2PACz), or (4-(3,6-Dimethyl-9H-carbazol-9-yl)butyl) phosphonic acid (Me-4PACz), (2-(3,6-Dibromo-9H-carbazol-9-yl)ethyl)phosphonic acid (Br-2PACz), or combinations thereof. As discussed above, in some embodiments, the first CTL layer 130, being configured to act as an HTL, may include a plurality of layers where each layer of the plurality of layers may include a different hole transport material. The different hole transport materials may include, but are not limited to, nickel oxide, PTAA, a SAM, or the like. For example, a multilayer HTL may include a plurality of layers where the plurality of layers comprise, nickel oxide and PTAA, nickel oxide and a SAM, a SAM and PTAA, or the like. As discussed above, in some embodiments, the first CTL layer 130, being configured to act as an ETL, may include a plurality of layers where each layer of the plurality of layers may include a different electron transport material. The different electron transport materials may include, but are not limited combinations of tin dioxide (SnO$_2$), a SAM, titanium dioxide (TiO$_2$), zinc oxide (ZnO), or the like. For example, a multilayer ETL may a plurality of layers, where the plurality of layers comprise SnO$_2$ and a SAM, TiO$_2$ and ZnO, or the like.

At operation 1020, as shown in FIGS. 8D and 9D, an absorber layer 140 is formed over the first CTL layer 130. In some embodiments, the absorber layer 140 is disposed on the first CTL layer 130. In one or more embodiments, the absorber layer 140 is formed using a blanket deposition process over the first CTL layer 130 of the photovoltaic device array 201. In some embodiments, the absorber layer 140 includes an absorber material that may include, a perovskite material. In one example, the absorber layer includes a perovskite material that has the stoichiometry of ABX$_3$, where A is a first cation, B is a second cation, and X comprises at least one halide (e.g., chloride, bromide, or iodide). In another example, the absorber layer 140 includes a perovskite that has a stoichiometry of ABX$_3$, where A comprises at least one of formamidinium (FA), methylammonium (MA), or cesium, and B comprises at least one of tin or lead, and X comprises at least one halide, methylammonium lead tri-iodide (MAPbl3), cesium formamidinium methylammonium lead tri-iodide (CsFAMAPbl3), silicon (amorphous and/or crystalline), Group III-V materials (amorphous and/or crystalline), organic photovoltaic materials (OPV), dye-sensitized PV cells (DSSX), copper indium gallium selenide (CIGS), cadmium telluride (CdTe), or combinations thereof.

The absorber layer 140 may be formed by any suitable solution based deposition process including, but not limited to printing, slot-die coating, spray-coating, gravure printing, or any combination thereof. The deposited absorber layer 140 has an absorber layer thickness in the Z-direction between about 300 nm to about 900 nm. For example, the absorber thickness is between about 450 nm to about 950 nm, preferably between about 500 nm to about 650 nm. In some embodiments, the absorber layer 140 may have an absorber thickness between about 900 nm to about 2000 nm.

Figure 9F:
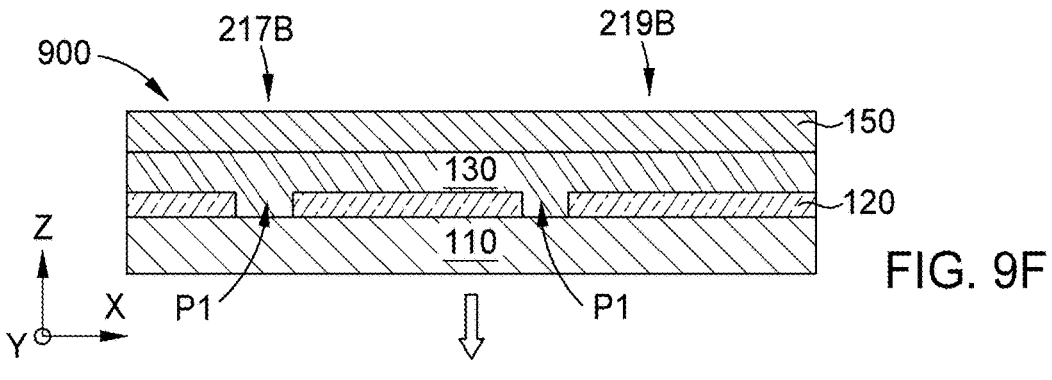
Figure 9G:
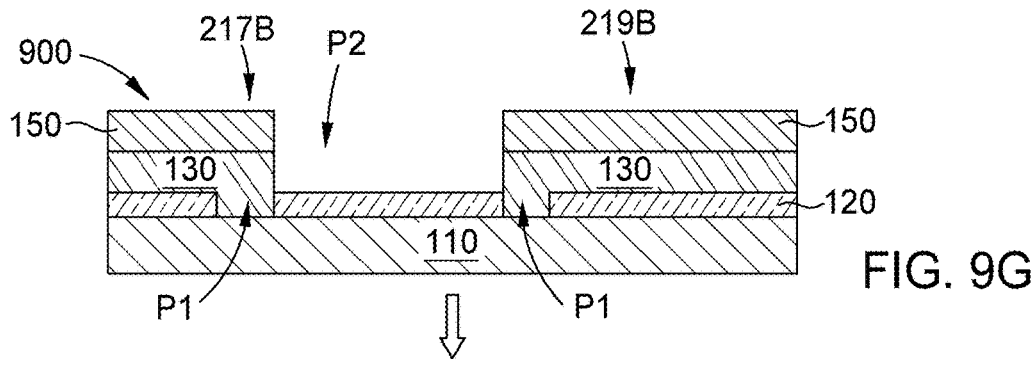

At operation 1025, as shown in FIGS. 8E and 9E, the absorber layer 140 is removed over the diode regions 209A and 209B, which includes the portion 900 illustrated in FIG. 9G, by performing a first diode scribing process P1.5 in which first diode scribed regions are formed over the portion 900. As shown in FIG. 9D, the first diode scribing process P1.5 completely removes the absorber layer 140 from the diode regions 209A and 209B, which includes the portion 900 while the absorber layer 140 remains within the PV cell region 209C, which is illustrated in portion 800 in FIG. 8E. Stated differently, the first diode scribe process P1.5 only removes the absorber layer 140 from the diode regions 209A and 209B, as illustrated in the portion 900 in FIG. 9E. The first diode scribe regions P1-A are formed so that the P1.5 scribe extends through the absorber layer 140, which leaves a significant portion of the first CTL layer 130 remaining over the over the portions of the first contact layer 120 and first surface of the first substrate layer 110 of the photovoltaic device array 201. The first diode scribe regions P1-A used to remove the absorber layer 140 can include a plurality of scribe lines that are formed in a spaced apart parallel relationship in a first direction (e.g., X-direction) by rastering a laser beam across the lateral area of the diode regions 209A and 209B. However, the first diode scribe regions P1-A may be formed by any suitable process, including, but not limited to, mechanical scribing systems, laser ablation, or combination thereof. In one or more embodiments, the absorber layer 140 may be selectively deposited over the PV cell region 209C so that the diode regions 209A and 209B do not include a portion of the deposited absorber layer 140. The selective absorber layer deposition process may include the use of a deposited masking layer or use of a shadowing pattern mask during the absorber layer 140 deposition process. Furthermore, in one or more embodiments, the absorber layer 140 can be removed from the diode regions 209A and 209B (i.e., the first diode scribe regions P1-A may be formed) by mechanical scrapping or washing away the absorber layer formed over the diode regions 209A and 209B with a solvent.

Figures 8F, 8G, 8H, 8I:
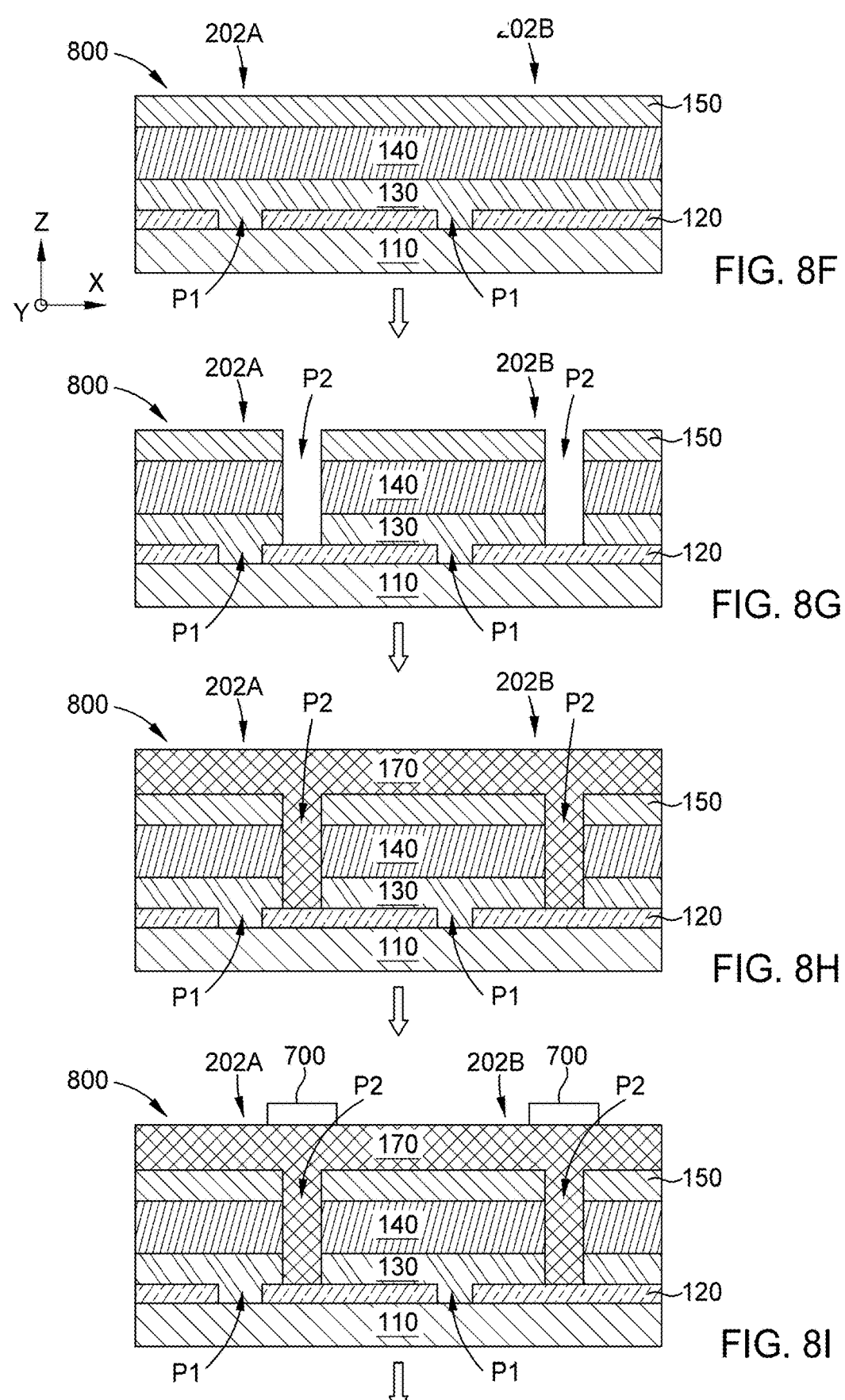

At operation 1030, as shown in FIGS. 8F and 9F, a second charge transport layer (CTL layer) 150 is simultaneously deposited over the absorber layer 140 within the PV cell region 209C and the exposed portion the first CTL layer 130 within the diode regions 209A and 209B. The second CTL layer 150 is deposited over the photovoltaic device array 201 using a blanket deposition process. As shown in FIG. 8F, the second CTL layer 150 is deposited over the absorber layer 140 in the portion 800. As shown in FIG. 9F, the second CTL layer 150 is deposited over the first CTL layer 130 in the diode region 209B.

Because the absorber layer 140 was removed within the diode regions 209A and 209B, as shown in FIG. 9F by portion 900 (i.e., the diode regions), the second CTL layer 150 is in direct contact with the first CTL layer 130 within the diode regions 209A and 209B. The second CTL layer 150 may be configured to act as a hole transport layer (HTL) including a hole transport material, or to act as an electron transport layer (ETL) including an electron transport material, which is an opposite carrier type of the carrier type found in the first CTL layer 130. In some embodiments, the second CTL layer 150 may include a plurality of layers, where each layer of the plurality of layers may include a different material dependent upon the configuration (e.g., HTL versus ETL) of the second CTL layer 150. In one example, the second CTL layer 150 is an ETL that includes, but is not limited to, a metal oxide such as at least one of $TiO_2$, $SnO_2$, $Al_2O_3$, ZnO, or carbon contacts such as carbon nanotubes, fullerenes (e.g., $C_{60}$ and or $C_{70}$), a fullerene derivative [6,6]-phenyl-C61-butyric acid methyl ester (PCBM), or fullerenes used alone or in conjunction with bathocuproine (BCP) or $SnO_2$, or other metal oxide, or combination thereof. As discussed above, in some embodiments, the second CTL layer 150, being configured to act as an ETL, may include a plurality of layers where each layer of the plurality of layers may include a different electron transport material. In one embodiment, the second CTL layer 150 includes a first sub-CTL layer and a second sub-CTL layer. For example, a multilayer ETL may a plurality of layers where the plurality of layers comprise $C_{60}$ or a self-assembled-monolayer (SAM), $C_{60}$ or BCP, or the like. The second CTL layer 150 has a second CTL layer thickness between about 0.1 nm to about 1 μm. The second CTL layer 150 may be formed by any suitable process including, but not limited to vacuum evaporation, atomic layer deposition, sputtering, chemical vapor deposition, or combination thereof. In one or more embodiments, the first CTL layer 130 and the second CTL layer 150 may be different doped differently of layers. For example, the first CTL layer 130 may be an n-type layer and the second CTL layer may be a p-type layer (or vice versa).

In other embodiments, the second CTL layer 150 may be deposited over a buffer layer (not shown) formed over the absorber layer 140 disposed within the PV cell region 209C and over the diode regions 209A and 209B by use of a blanket deposition process. Thus, the buffer layer may be disposed over the exposed portions of the absorber layer 140 and exposed portion of the first CTL layer 130 within the diode regions 209A and 209B. In another example, a buffer layer may be formed over the second CTL layer 150. Thus, the buffer layer may be disposed over the exposed portions of the second CTL layer 150. In some embodiments, the buffer layer has a thickness in the Z-direction between about 0.1 nm to about 20 nm. The buffer layer can comprise a material with a bandgap typically larger than the absorber layer 140 which may passivate the perovskite surface and/or slow the surface recombination rate, create a tunneling barrier, and/or otherwise change the interfacial properties between absorber layer 140 and the second CTL layer 150. The buffer layer can comprise, but is not limited to, oxides, oxysalts, sulfates, organics, organic salts, and fluorides. The buffer layer may be formed by any suitable process including, but not limited to a solution based deposition process, a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., evaporation process), or other suitable deposition technique. In one example, the deposited buffer layer has a total thickness between about 0.4 nm to about 40 nm.

At operation 1035, as shown in FIGS. 8G and 9G, a plurality of second scribe lines P2 are formed through a portion of each of the PV cells 202 and over the first electrode regions 207 of the diodes 210 within the diode regions 209A and 209B. As shown in FIG. 8G, the second scribe lines P2 in the portion 800 (i.e., extend) through the first CTL layer 130, absorber layer 140, and the second CTL layer 150, and expose a portion of the first contact layer 120. In some embodiments, each of the formed second scribe lines P2 may extend into a portion of the first contact layer 120. The second scribe lines P2 each include a sidewall surface that contains portions of the second CTL layer 150, a portion of the absorber layer 140, a portion of the first CTL layer 130, and a portion of the first contact layer 120. The second scribe lines P2 may be formed by any suitable process, including, but not limited to, mechanical scribing systems, laser ablation, or combination thereof. The second scribe lines P2 within the portion 800 are positioned on a first side (e.g., right side in FIG. 8G) of the first scribe lines P1 and a second side that is opposite to the first side of the first scribe lines P1 (e.g., left side in FIG. 8G). A region formed between a third scribe line P3 and a first scribe line P1 forms a primary light absorption region where the electrons and holes pairs are generated by the exposure to light which forms the photocurrent.

In one or more embodiments, as shown in FIG. 9G, the second scribe regions P2 formed during the second scribe line P2 process remove the portions of the first CTL layer 130 and the second CTL layer 150 of the PV cell 202A located within the first electrode region 217B, and expose the first contact layer 120 of the PV cell 202A located within the first electrode region 217B. On the other hand, the second electrode region 219B is not scribed during this operation. Advantageously, this allows for a second contact layer 170 of the PV cell 202A, which is formed in a subsequent operation to have direct contact with first contact layer 120 of the PV cell 202A in the first electrode region 217B, forming a cathode for example. In one or more embodiments, as noted above, the first contact layer 120 and the second contact layer 170 may each include multiple conductive layers, such as a plurality of transparent conductive oxide layers. In some embodiments, in which the first contact layer 120 and/or the second contact layer 170 include multiple layers, the layers of the first contact layer 120 and the second contact layer 170 are in direct contact with each other.

On the other hand, by allowing the first CTL layer 130 and the second CTL layer 150 of the PV cell 202B to remain within the second electrode region 219B (non P2 scribed portion) of the portion 900 allows for the forming of the anode of the diode 210A, for example. The portion of the first CTL layer 130 and the second CTL layer 150 of the PV cell 202B formed in the second electrode region 219B are substantially electronically isolated from the portion of the first contact layer 120 formed in the first electrode region 217B.

Figure 9H:
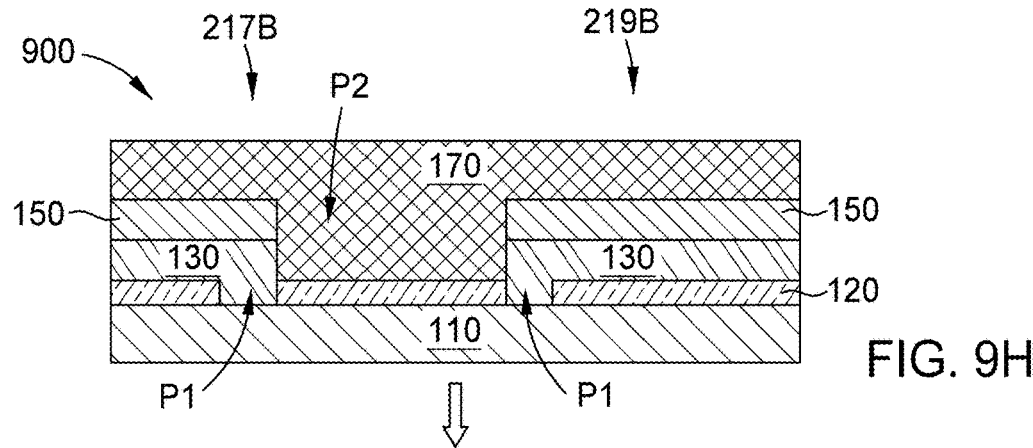

At operation 1040, as shown in FIGS. 8H and 9H, a second contact layer 170 is formed over photovoltaic device array 201. The second contact layer 170 is formed over the PV cell region 209C, which includes portion 800 illustrated in FIG. 8H, and the diode regions 209A and 209B, which includes the portion 900 illustrated in FIG. 9H, by use of in a blanket deposition process. As shown in FIG. 8H, the second contact layer 170 is formed over the second CTL layer 150, absorber layer 140, first CTL layer 130, the first contact layer 120, and the first substrate layer 110 in the portion 800. The second contact layer 170 is disposed over the second CTL layer 150 and fills at least a significant portion or all of the second scribe line P2.

As shown in FIG. 9H, in the portion 900, the second contact layer 170 is formed over the exposed first contact layer 120 of the PV cell 202A to the left of the first scribe lines P1 and over the first CTL layer 130 and the second CTL layer 150 of the PV cell 202B to the left of the first scribe lines P1 of the portion 900. Thus, the portion of the second contact layer 170 of the PV cell 202A located in the first electrode region 217B is in direct contact with the portion of the first contact layer 120 of the PV cell 202A located within the first electrode region 217B. On the other hand, the portion of the second contact layer 170 of the PV cell 200B located within the second electrode region 219B is formed over the portion of the second CTL layer 150 of the PV cell 202B located within the second electrode region 219B.

The second contact layer 170 may be formed from any suitable contact layer material as described above. In one example, the second contact layer 170 includes a TCO layer, such as an IZO or ITO layer. The second contact layer 170 has a first thickness in the Z-direction of between about 5 nm to about 900 nm. The second contact layer 170 may be formed by any suitable process including, but not limited to a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process, printing, spraying or other suitable deposition technique.

Figure 9I:
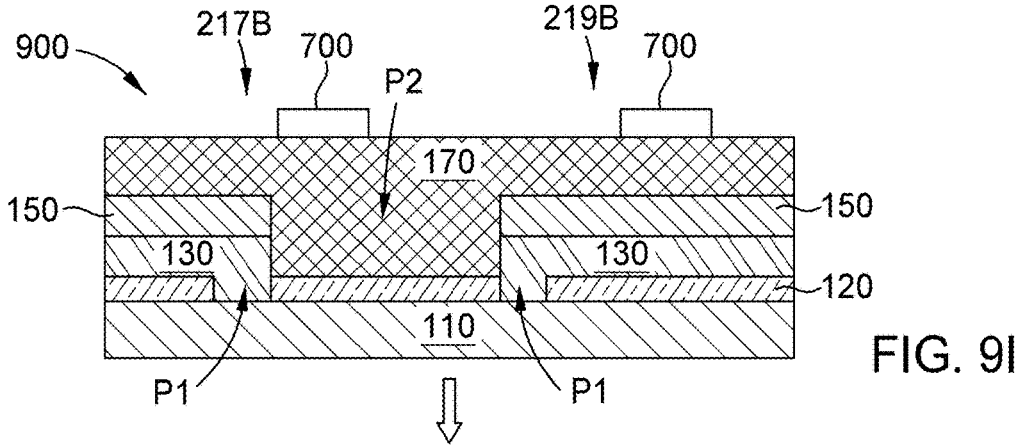

At operation 1045, as shown in FIGS. 8I and 9I, the wires 700 are formed over photovoltaic device array 201. The wires 700 are formed onto a portion of the second contact layer 170 formed within the PV cell regions 209A, 209B and 209C. As noted above, the wires 700 include branch wires 702 and lateral wires 704 formed in a grid like fashion across the photovoltaic device array 201 (FIGS. 7A-7E). The wires

700 are a formed from a conductive material such as a metal including, but not limited to, silver, copper, chromium, or the like. The lateral wires 704 are configured to couple portions of the PV cells 202 to corresponding diodes. In the same manner described above, the lateral wires 704 are used to couple an anode 219 of a diode to the main portion of the PV cell. As noted above, the wires 700 may be formed by screen printing, physical installation, or via a conductive adhesive. Also as noted above, the wires 700 are formed with a minimal resistance so that current flow is minimally restricted with minimal coverage of the light receiving surface of the PV cells to reduce the blockage of the received light. The wires 700 may have any cross-sectional shape or aspect ratio, such as circular, triangular, or the like as described above in FIGS. 7A-7E.

Figures 8J, 8K, 8L:
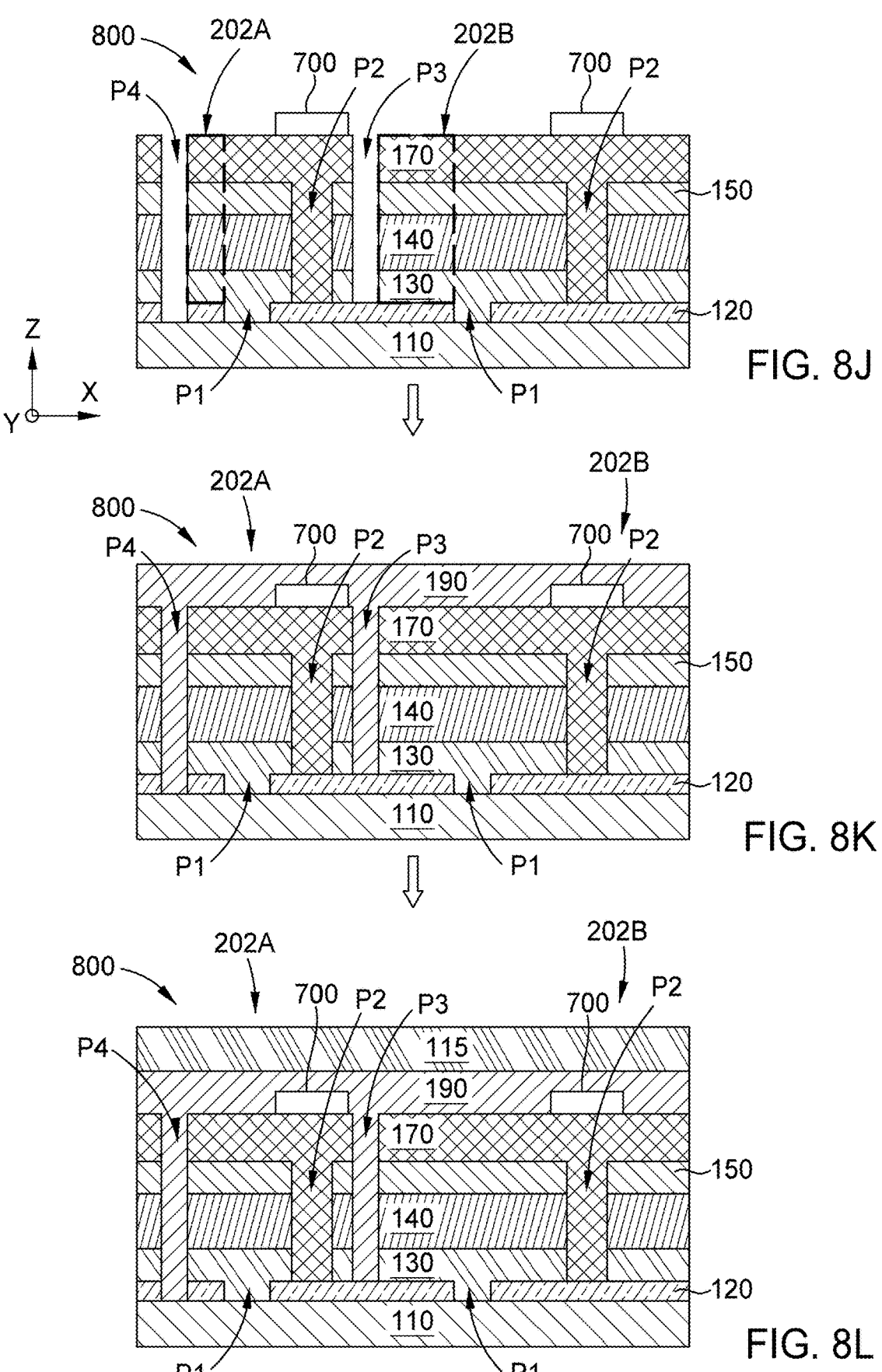
Figure 9J:
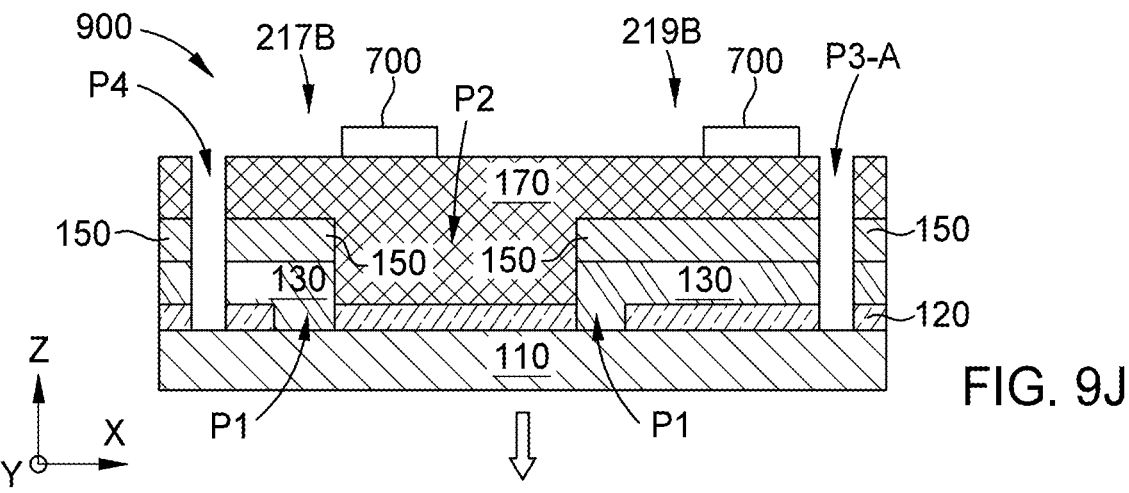

At operation 1050, as shown in FIGS. 8J and 9J, third scribe lines P3, second diode scribe lines P3-A, and fourth scribe lines P4 are formed through portions of the photovoltaic device array 201. As noted above, the third scribe lines P3 is also referred to herein as the third scribe line 205 in FIGS. 2A-2B. In one or more embodiments, the third scribe lines P3 and the fourth scribe lines are formed within the portion 800. The second diode scribe lines P3-A and the fourth scribe lines P4 are formed within the portion 900.

Within the PV cell region 209C, as illustrated in FIG. 8J, each of the third scribe lines P3 extend through the second contact layer 170, the second CTL layer 150, and at least a significant portion of the absorber layer 140. In some embodiments, as shown in FIG. 8J, the third scribe lines P3 extend through the second contact layer 170, the second CTL layer 150, the absorber layer 140, and the first CTL layer 130, and expose a portion of the first contact layer 120. In some embodiments, the third scribe line P3 may extend into a portion of the first contact layer 120. The third scribe lines P3 each include a surface that contains portions of the second contact layer 170, the second CTL layer 150, the absorber layer 140, the first CTL layer 130, and the first contact layer 120. The third scribe lines P3 are positioned on the first side (e.g., right side in FIG. 8J) of the first scribe lines P1 and the second scribe line P2. The third scribe lines P3 separate adjacent PV cells 202. For example, a PV cell 202 is positioned to the left of the third scribe lines P3 and a PV cell 202 is located to the right of the third scribe lines P3. As illustrated in FIG. 8J, one with ordinary skill in the art would understand that the PV cells are formed between the third scribe lines P3 and the first scribe lines P4 as indicated by the dashed boxes in FIG. 8J.

Within the portion 900, as illustrated in FIG. 9J, each of the second diode scribe lines P3-A extend through the second contact layer 170, and the first contact layer 120. The second diode scribe lines P3-A each include a surface that contains portions of the second contact layer 170, and the first contact layer 120. The second diode scribe lines P3-A are positioned on the first side (e.g., right side in FIG. 9J) of the first scribe lines P1 and the second scribe lines P2.

Referring to FIGS. 2A-2C and 6, as part of the third scribe line P3 formation process a portion of the third scribe line P3 that is used to separate adjacent PV cells 202, such as PV cells 202A and 202B illustrated in FIG. 8G, will include the formation of diode isolation scribe portion P3-D that is positioned at the end of the third scribe line P3 that separates the PV cells 202A and 202B and forms an edge of a first electrode region 217A of a diode 210, such as the first electrode region 217B of the diode 210A. The formed diode isolation scribe portion P3-D is used to electrically isolate the portion of the second contact layer 170 disposed over the second CTL layer 150 within the PV cell 202A with the portion of the second contact layer 170 within the first electrode region 217B of the diode 210A. The length of the diode isolation scribe portion P3-D will include the width of the PV cell 202A (e.g., X-direction dimension) and have a depth that is similar to the depth of the third scribe line P3 used to separate the PV cells 202A and 202B. In one example, as shown in FIG. 6, the diode isolation scribe portion P3-D has a depth that allows a portion of the first contact layer 120 to be exposed therein. In another example, the diode isolation scribe portion P3-D has a depth that extends at least through the thickness of the second contact layer 170 disposed over the second CTL layer 150. Furthermore, referring to FIGS. 2A-2C, 3, and 5 the second diode scribe lines P3-A may used to separate adjacent diodes formed in a same diode region (e.g., diodes 210A and 210C).

In one or more embodiments, the third scribe lines P3 and the second diode scribe lines P3-A may be formed by any suitable process, including, but not limited to, mechanical scribing systems, laser ablation, or combination thereof. In some examples of the present disclosure, the third scribe lines P3 and the second diode scribe lines P3-A may each have a width within the lateral plane (i.e., X-Y-plane) between 5 μm and 200 μm. In one or more embodiments, the second diode scribe lines P3-A may be formed by forming a third scribe line P3 over a first scribe line P1. In one or more embodiments, the metal wires 700 can be formed after the third scribe lines P3 and the second diode scribe lines P3-A are formed.

During operation 1050, the fourth scribe lines P4 are formed through the photovoltaic device array 201. The fourth scribe lines P4 are separate from the third scribe lines P3 and the second diode scribe lines P3-A, and are used to isolate the photovoltaic device array 201 from the unusable edge portions of the photovoltaic device 200 formed at the edge of the first substrate layer 110 of the photovoltaic device 200. Within the portion 800, as illustrated in FIG. 8J, the fourth scribe lines P4, extend through the second contact layer 170, the second CTL layer 150, the absorber layer 140, the first CTL layer 130, and the first contact layer 120 and generally to the top surface of the first substrate layer 110. In some embodiments, the fourth scribe line P4 may extend into the first substrate layer 110. In some embodiments the fourth scribe lines P4 may be wide enough to extend to the edge of the photovoltaic device 200. The fourth scribe lines P4 each include a surface that contains portions of the second contact layer 170, the second CTL layer 150, the absorber layer 140, the first CTL layer 130, the first contact layer 120, and the first substrate layer 110.

Within the portion 900, as illustrated in FIG. 9J, the fourth scribe lines P4 that are parallel to the portion of the third scribe lines P3 (e.g., diode isolation scribe portion P3-D) that separates the PV cells 202 (e.g., third scribe lines P3 that is parallel to the Y-direction). In general, the fourth scribe lines P4 extend through the second contact layer 170, the second CTL layer 150, the first CTL layer 130, and the first contact layer 120 and generally to the top surface of the first substrate layer 110 and are positioned parallel to the edge regions 203A-203D. In some embodiments, a fourth scribe line P4 may extend into the first substrate layer 110. In some embodiments the fourth scribe lines P4 may be wide enough to extend to the edge of the photovoltaic device 200. The fourth scribe lines P4 each include a surface that contains portions of the second contact layer 170, the second CTL layer 150, the first CTL layer 130, the first contact layer 120, and the first substrate layer 110 within the second electrode regions 219B of the diodes 210, and includes a surface that contains portions of the first contact layer 120 and second contact layer 170 of the first electrode region 217B of the diodes 210.

Figure 9K:
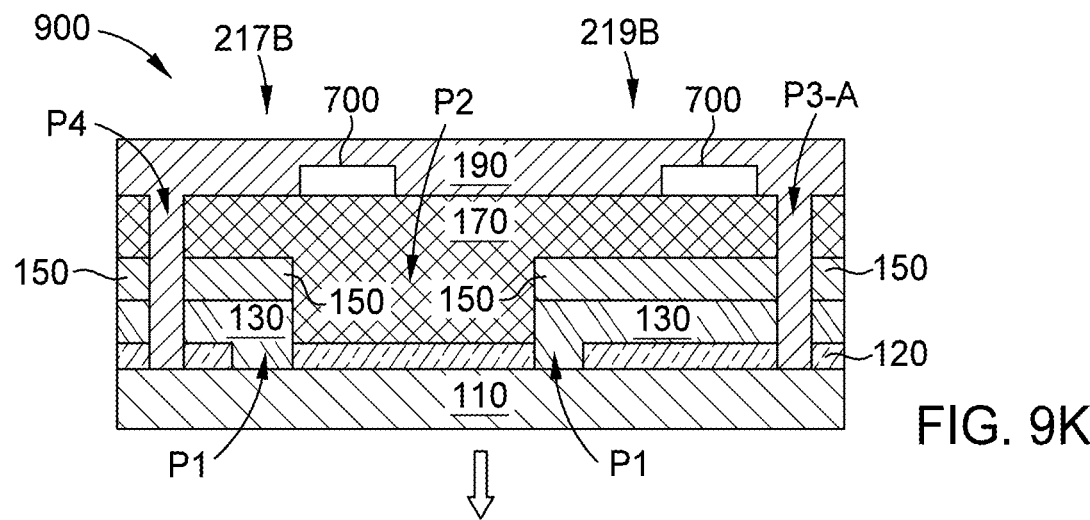

At operation 1055, as shown in FIGS. 8K and 9K, an encapsulation layer 190 is disposed and/or formed over the device layer stack. As shown in FIGS. 8K and 9K, the encapsulation layer 190 is disposed over the second contact layer 170 and fills the voids created by the third scribe lines P3 in the portion 800 (the PV cell region) and the second diode scribe line P3-A in the portion 900 (the diode regions), and the fourth scribe lines P4. The encapsulation layer 190 includes an encapsulation material. The encapsulation material may include, but is not limited to, ethylene vinyl acetate (EVA), polyolefin, polyurethane, polyvinyl butyral, ionomers or combination thereof. The encapsulation layer 190 has an encapsulation thickness between about 0.1 mm to about 5 mm. The encapsulation layer 190 may be formed by any suitable process including, but not limited to, a lamination process, casting, an autoclave process, or other common deposition and/or attachment techniques.

In some embodiments, prior to operation 1055 one or more barrier layers may be formed over the device stack. For example, the one or more barrier layers may be deposited over the second contact layer 170, wires 700, and the exposed surfaces of the third scribe lines P3 and the fourth scribe lines P4, and partially fill the openings formed by the third scribe lines P3 and the fourth scribe lines P4. The encapsulation layer 190 may be formed over the one or more barrier layers.

The one or more barrier layers include a barrier material. Each barrier layer of the one or more barrier layers may include a different barrier material. The barrier materials of the one or more barrier layers may include a metal oxide. In one example, the one or more barrier layers include, but are not limited to, a material that comprises aluminum oxide, silicon oxide, tin oxide, titanium oxide, zirconium oxide, or combination thereof. The barrier materials of the one or more barrier layers may include a styrenic polymer, a polysiloxane, an amine-containing polymer, a polyacrylate, an aryl ammonium halide, an alkyl ammonium halide, a fluorinated hydrocarbon polymer, or a combination thereof. In another example, the one or more barrier layers include, but are not limited to, a styrenic polymer such as polystyrene (PS), acrylonitrile butadiene styrene (ABS), acrylonitrile-styrene-acrylate (ASA) or styrene-butadiene rubber (SBR). In another example, the one or more barrier layers include, but are not limited to, a polysiloxane such as poly(dimethylsiloxane), poly(diethylsiloxane) or poly(methylphenylsiloxane). In another example, the one or more barrier layers include, but are not limited to, a amine-containing polymer such as polyethylenimine (PEIE), poly(vinylamine) hydrochloride (PVH), or poly(ethylene glycol) bis(amine) (PEG-Amine). In another example, the one or more barrier layers include, but are not limited to, a polyacrylate such as polymethylmethacrylate (PMMA) or polyethylacrylate. In another example, the one or more barrier layers include, but are not limited to, an aryl ammonium halide such as phenethylammonium iodide (PEAI), 1-(ammonium acetyl) pyrene (PEY) or dodecyl ammonium-chloride (DACI). In another example, the one or more barrier layers include, but are not limited to, an alkyl ammonium halide such as n-propylammonium iodide (PAI), ethane-1,2-diammonium (EDA), 2-chloroethylamine (CEA) or 2-bromo-ethylamine (BEA). In another example, the one or more barrier layers include, but are not limited to, a fluorinated hydrocarbon polymer such as Nafion™, polytetrafluoroethylene, polyvinylidene-fluoride, or trifluoroethylene. The one or more barrier layers have a barrier thickness between about 1 nm to about 5 μm. The one or more barrier layers 180 may be conformally deposited by any suitable process, for example, a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., thermal evaporation), or solution processing methods such ink-jet printing, slot-die coating, spray-coating, gravure printing, blanket coating. In some embodiments, the solution processing methods include an annealing process.

Figure 9L:
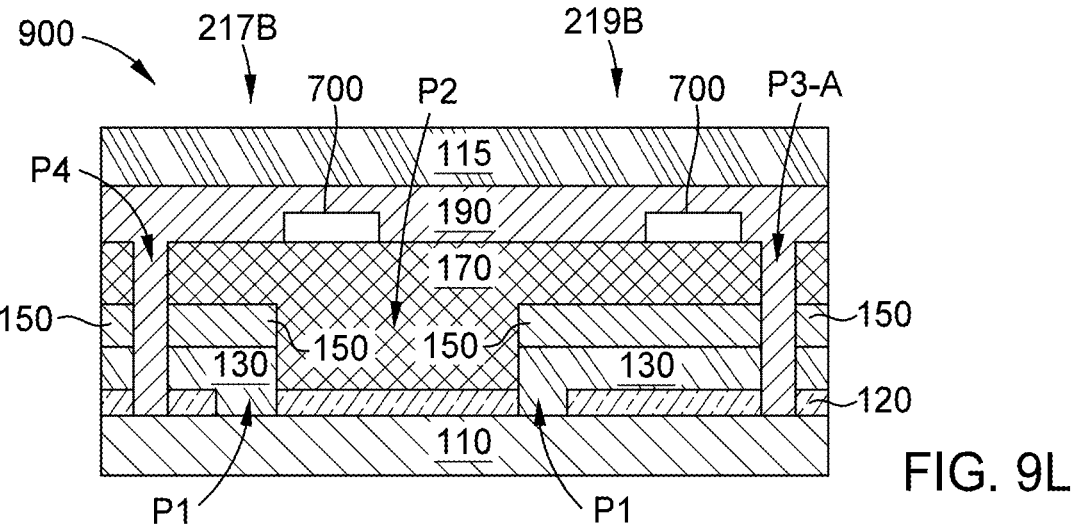

At operation 1060, as shown in FIGS. 8L and 9L, a second substrate layer 115 is disposed on and/or coupled to the encapsulation layer 190. The second substrate layer 115 has a second substrate thickness between about 0.05 mm to about 5 mm. In some embodiments, as discussed above, second substrate layer 115 can include one or more materials selected from a group that includes a metal foil, silicon, glass, and/or a polymer substrate. In some embodiments, as discussed above, second substrate layer 115 is glass with a thickness between about 1 mm and 3 mm.

ADDITIONAL CONSIDERATIONS

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate. While the various steps in an embodiment method or process are presented and described sequentially, one of ordinary skill in the art will appreciate that some or all of the steps may be executed in different order, may be combined, or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

As used herein, "gas" and "fluid" may be used interchangeable with either term generally referring to elements, compounds, materials, etc., having the properties of a gas, a fluid, or both a gas and a fluid.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward," "horizontal," "vertical," and the like do not refer to absolute directions. Instead, these terms refer to directions relative to a nonspecific plane of reference. This non-specific plane of reference may be vertical, horizontal, or other angular orientation.

The singular forms "a", "an", and "the", include plural referents, unless the context clearly dictates otherwise. Within a claim, reference to an element in the singular is not intended to mean "one and only one" unless specifically so stated, but rather "one or more". Unless specifically stated otherwise, the term "some" refers to one or more.

Embodiments of the present disclosure may suitably "comprise", "consist", or "consist essentially of", the limiting features disclosed, and may be practiced in the absence of a limiting feature not disclosed. As used here and in the appended claims, the words "comprise", "has", and "include", and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

"Coupled" and "coupling" means that the subsequently described material is connected to previously described material. The connection may be a direct, or indirect connection, and may, or may not, include intermediary components such as plumbing, wiring, fasteners, mechanical power transmission, electrical communication, wired and/or wireless transmission, etc., which may suitable to affect operation of the components.

When the word "approximately" or "about" are used, this term may mean that there may be a variance in value of up to +10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. It is the express intention of the applicant not to invoke 35 U.S.C. § 112(f), for any limitations of any of the claims, except for those in which the claim expressly uses the words 'means for' together with an associated function.

While the foregoing is directed to examples of the present disclosure, other and further examples of the disclosure may be devised without departing from the basic scope thereof, and the scope thereof is determined by the claims that follow.

What is claimed is:

1. A photovoltaic device comprising:
a plurality of photovoltaic (PV) cells coupled in series, wherein the plurality of PV cells comprise:
a first contact layer;
a first charge transport layer (CTL layer) disposed over the first contact layer;
an absorber layer disposed over the first CTL layer;
a second CTL layer disposed over the absorber layer; and
a second contact layer disposed over the second CTL layer, wherein the plurality of PV cells comprise a first PV cell and a second PV cell that are adjacent to one another and separated by a first scribe line; and
a plurality of diodes positioned in diode regions that are located on opposite edges of the plurality of PV cells, wherein the plurality of diodes are coupled in series and are configured to form a diode between adjacent PV cells of the plurality PV cells, wherein each of the plurality of diodes comprise:
a portion of the first contact layer of the first PV cell located in a first electrode region and a portion of the first contact layer of the second PV cell located in an second electrode region, the first electrode region of the first contact layer being coupled to the first PV cell and the second electrode region of the first contact layer being coupled to the second PV cell, the portion of the first contact layer of the first PV cell located in the first electrode region and the portion of the first contact layer of the second PV cell located in the second electrode region being electronically isolated from each other;
a portion of the first CTL layer and the second CTL layer of the second PV cell positioned over the portion of the first contact layer of the second PV cell located in the second electrode region and a portion of the first CTL layer and the second CTL layer of the first PV cell are not included in the first electrode region; and
a portion of the second contact layer of the first PV cell positioned over and in direct contact with the portion of the first contact layer of the first PV cell positioned in the first electrode region.

2. The photovoltaic device of claim 1, wherein the first electrode region is electronically isolated from the first PV cell via a second scribe line that extends through the second contact layer of the first PV cell located within the first electrode region.

3. The photovoltaic device of claim 1, wherein the diode regions comprise a first diode region located on a first horizontal edge of the PV cells and a second diode region located on a second horizontal edge of the PV cells.

4. The photovoltaic device of claim 3, wherein the first diode region comprises a first diode comprising a first first electrode region and a first second electrode region, the first first electrode region coupled to the first PV cell and the first second electrode region coupled to the second PV cell.

5. The photovoltaic device of claim 4, wherein the plurality of PV cells further comprise a third PV cell that is adjacent to the second PV cell and a fourth PV cell that is adjacent to the third PV cell, and the second diode region comprises a second diode having a second first electrode region and a second second electrode region, the second first electrode region being coupled to the third PV cell and the first second electrode region and the second second electrode region being coupled to the fourth PV cell.

6. The photovoltaic device of claim 1, further comprising a plurality of wires comprising horizontal wires and lateral wires that are positioned in a grid-like fashion in the second contact layer of the first PV cell and the second PV cell.

7. The photovoltaic device of claim 6, wherein the lateral wires have a fir dimension that decreases in size along a first axis and the horizontal wires have a second dimension that decreases in size along a second axis, the first axis being different than the second axis.

8. The photovoltaic device of claim 1, further including an encapsulation layer disposed over the second contact layer in the first PV cell, the portion of the second contact layer of the first PV cell located in the first electrode region, the portion of the second contact layer of the second PV cell located in the second electrode region, and the second contact layer in the second PV cell.

9. The photovoltaic device of claim 1, wherein the second CTL layer comprises a first sub-CTL and a second sub-CTL, and the first sub-CTL is disposed between the absorber layer and the second sub-CTL.

10. A method comprising:
forming a first charge transport layer (CTL layer) over a patterned first contact layer, wherein the patterned first contact layer comprises:
a first portion of a first contact layer positioned over a surface of a first substrate;
a second portion of the first contact layer positioned over the surface of the first substrate, wherein a first scribe line is positioned between the first portion and the second portion;
the first portion of the first contact layer comprises a first PV cell region and a first electrode region; and
the second portion of the first contact layer comprises a second PV cell region and an second electrode region;
forming an absorber layer over the first CTL layer, wherein the absorber layer is formed over the first PV cell region, the second PV cell region, the first electrode region, and the second electrode region;
removing, by use of a scribing process, the absorber layer formed over the first electrode region and the second electrode region;
forming a second CTL layer over the absorber layer of the first PV cell region and the second PV cell region, and over the first electrode region, and the second electrode region;
removing, by use of a scribing process, a portion of the first CTL layer and the second CTL layer formed over the first electrode region, wherein removing the portion of the first CTL layer exposes a portion of the first contact layer within the first electrode region;

depositing a second contact layer over the second CTL layer within the first PV cell, the second PV cell, and the second electrode region, and over the exposed portion of the first electrode region;

removing, by use of a scribing process, a first portion of the second contact layer positioned between the first PV cell region and the second PV cell region; and removing, by use of a scribing process, a second portion of the second contact layer positioned between a portion of the first PV cell region and the first electrode region.

11. The method of claim 10, further comprising forming an encapsulation layer over the second contact layer in the first PV cell region, the second PV cell region and the first electrode region and the second electrode region.

12. The method of claim 10, further comprising forming a plurality of wires in a grid-like fashion in onto the second contact layer in the first PV cell, the portion of the second contact layer of the first PV cell located in the first electrode region, the portion of the second contact layer of the second PV cell located in the second electrode region, and the second contact layer in the second PV cell, the wires comprising branch wires and lateral wires.

13. The method of claim 12, wherein the wires are formed by screen printing, physical installation or via a conductive adhesive.

14. A photovoltaic device comprising:

a plurality of photovoltaic (PV) cells coupled in series, wherein the plurality of PV cells comprise:

a first contact layer;

a first charge transport layer (CTL layer) disposed over the first contact layer;

an absorber layer disposed over the first CTL layer;

a second charge transport layer (CTL layer) disposed over the absorber layer; and a second contact layer disposed over the second CTL layer, wherein the plurality of PV cells comprise a first PV cell and a second PV cell that are adjacent to one another and separated by a first scribe line; and a plurality of diodes positioned in diode regions located on opposite edges of the plurality of PV cells that are coupled in series, the plurality of diodes configured to couple adjacent PV cells of the plurality PV cells, wherein each of the diodes comprise:

a portion of the first contact layer of the first PV cell located in a first electrode region and a portion of the first contact layer of the second PV cell located in an second electrode region, the first electrode region being coupled to the first PV cell and the second electrode region being coupled to the second PV cell, the portion of the first contact layer of the first PV cell located in the first electrode region and the portion of the first contact layer of the second PV cell located in the second electrode region being electronically isolated from each other;

a portion of the first CTL layer and the second CTL layer of the second PV cell positioned over the portion of the first contact layer of the second PV cell located in the second electrode region and a portion of the first CTL layer and the second CTL layer of the first PV cell are removed from the first electrode region; and a portion of the second contact layer of the first PV cell positioned over and in direct contact with the portion of the first contact layer of the first PV cell positioned in the first electrode region, wherein the first electrode region is electronically isolated from the first PV cell via a second scribe line.

15. The photovoltaic device of claim 14, wherein the diode regions comprise a first diode region located on a first edge of the PV cells and a second diode region located on a second edge of the PV cells.

16. The photovoltaic device of claim 15, wherein the first diode region comprises a first diode comprising a first first electrode region and a first second electrode region, the first first electrode region coupled to the first PV cell and the first second electrode region coupled to the second PV cell.

17. The photovoltaic device of claim 16, wherein the plurality of PV cells further comprise a third PV cell that is adjacent to the second PV cell and a fourth PV cell that is adjacent to the third PV cell, and the second diode region comprises a second diode having a second first electrode region and a second second electrode region, the second first electrode region being coupled to the third PV cell and the first second electrode region and the second second electrode region being coupled to the fourth PV cell.

18. The photovoltaic device of claim 14, further comprising a plurality wires comprising branch wires and lateral wires that are positioned in a grid-like fashion in the second contact layer of the first PV cell and the second PV cell.

19. The photovoltaic device of claim 18, wherein the lateral wires have a first dimension that decreases in size along a first axis and the branch wires have a second dimension that decreases in size along a second axis, the first axis being different than the second axis.

20. The photovoltaic device of claim 14, further including an encapsulation layer disposed over the second contact layer in the first PV cell, the portion of the second contact layer of the first PV cell located in the first electrode region, the portion of the second contact layer of the second PV cell located in the second electrode region, and the second contact layer in the second PV cell.

* * * * *